(12) United States Patent
Shaya et al.

(10) Patent No.: US 11,888,456 B2
(45) Date of Patent: *Jan. 30, 2024

(54) METHODS AND SYSTEMS FOR AUTOMATICALLY EQUALIZING AUDIO OUTPUT BASED ON ROOM POSITION

(71) Applicant: GOOGLE LLC, Mountain View, CA (US)

(72) Inventors: Benjamin Louis Shaya, Mountain View, CA (US); Rasmus Larsen, San Jose, CA (US); Richard F Lyon, Los Altos, CA (US); Michael Smedegaard, Danville, CA (US)

(73) Assignee: GOOGLE LLC, Mountain View, CA (US)

( * ) Notice: Subject to any disclaimer, the term of this patent is extended or adjusted under 35 U.S.C. 154(b) by 344 days.

This patent is subject to a terminal disclaimer.

(21) Appl. No.: 17/191,510

(22) Filed: Mar. 3, 2021

(65) Prior Publication Data

US 2021/0194447 A1 Jun. 24, 2021

Related U.S. Application Data

(63) Continuation of application No. 16/719,847, filed on Dec. 18, 2019, now Pat. No. 11,005,440, which is a
(Continued)

(51) Int. Cl.
*H03G 5/16* (2006.01)
*H04R 1/40* (2006.01)
(Continued)

(52) U.S. Cl.
CPC ............ *H03G 5/165* (2013.01); *G06F 3/167* (2013.01); *H04R 1/403* (2013.01); *H04R 1/406* (2013.01);
(Continued)

(58) Field of Classification Search
CPC .......... H04R 1/403; H04R 3/04; H04R 3/005; H04R 3/12; H04R 29/001; H04R 2420/07; H03G 5/165; H03G 5/005
(Continued)

(56) References Cited

U.S. PATENT DOCUMENTS 4,340,780 A 7/1982 Odlen
5,754,774 A 5/1998 Bittinger et al.
(Continued)

FOREIGN PATENT DOCUMENTS

CN 103155526 A 6/2013
CN 103517178 A 1/2014
(Continued)

OTHER PUBLICATIONS

Yamaha, "Optimizing the speaker settings automatically (YPAO)," (2019). Retreived from the Internet at: <URL:https://manual.yamaha.com/av/18/rxv685/en-us/311793035.html>.
(Continued)

*Primary Examiner* — Disler Paul
(74) *Attorney, Agent, or Firm* — MARSHALL, GERSTEIN & BORUN LLP

(57) ABSTRACT

The various implementations described herein include methods, devices, and systems for automatic audio equalization. In one aspect, a method is performed at an electronic device that includes speakers, microphones, processors and memory. The electronic device outputs audio user content from the speakers and automatically equalizes subsequent audio output of the device without user input. The automatic equalization includes: (1) obtaining audio content signals, including receiving outputted audio content at each microphone; (2) determining from the audio content signals phase differences between microphones; (3) obtaining a feature vector based on the phase differences; (4) obtaining a
(Continued)

frequency correction from a correction database based on the obtained feature vector; and (5) applying the obtained frequency correction to the subsequent audio output.

20 Claims, 25 Drawing Sheets

Related U.S. Application Data continuation of application No. 16/058,885, filed on Aug. 8, 2018, now Pat. No. 10,523,172.

(60) Provisional application No. 62/568,219, filed on Oct. 4, 2017, provisional application No. 62/568,216, filed on Oct. 4, 2017.

(51) Int. Cl.
| | | |
|---|---|---|
| *H04R 3/12* | (2006.01) | |
| *H04R 3/00* | (2006.01) | |
| *G06F 3/16* | (2006.01) | |
| *H04R 3/04* | (2006.01) | |
| *H04S 7/00* | (2006.01) | |
| *H04R 29/00* | (2006.01) | |
| *G06N 3/04* | (2023.01) | |

(52) U.S. Cl.
CPC .............. *H04R 3/005* (2013.01); *H04R 3/04* (2013.01); *H04R 3/12* (2013.01); *H04R 29/001* (2013.01); *H04S 7/301* (2013.01); *H04S 7/305* (2013.01); *G06N 3/04* (2013.01); *H04R 2420/07* (2013.01); *H04R 2430/03* (2013.01); *H04S 2420/00* (2013.01)

(58) Field of Classification Search
USPC .............................................. 381/58–59, 103
See application file for complete search history.

(56) References Cited

U.S. PATENT DOCUMENTS

| | | | |
|---|---|---|---|
| 6,731,760 | B2 | 5/2004 | Pedersen |
| 6,766,025 | B1 | 7/2004 | Levy et al. |
| 7,769,183 | B2 | 8/2010 | Bharitkar et al. |
| 8,045,721 | B2 | 10/2011 | Burgan et al. |
| 8,331,585 | B2 | 12/2012 | Hagen et al. |
| 8,676,728 | B1 | 3/2014 | Velusamy et al. |
| 9,020,153 | B2 | 4/2015 | Britt, Jr. |
| 9,185,199 | B2 | 11/2015 | Zurek et al. |
| 9,219,460 | B2 | 12/2015 | Bush |
| 9,294,859 | B2 | 3/2016 | Ivanov et al. |
| 9,351,091 | B2 | 5/2016 | Ivanov et al. |
| 9,438,996 | B2 | 9/2016 | Maher et al. |
| 9,521,497 | B2 | 12/2016 | Schuster et al. |
| 9,689,960 | B1 | 6/2017 | Barton et al. |
| 9,763,018 | B1 | 9/2017 | McPherson et al. |
| 9,826,328 | B2 | 11/2017 | Mehta et al. |
| 9,952,825 | B2 | 4/2018 | Sheen |
| 9,992,595 | B1 | 6/2018 | Choisel et al. |
| 10,127,008 | B2 | 11/2018 | Sheen et al. |
| 10,149,087 | B1* | 12/2018 | Choisel ................ H04R 29/001 |
| 10,283,137 | B2* | 5/2019 | Pakarinen ........... G10L 21/0232 |
| 10,459,684 | B2 | 10/2019 | Shih et al. |
| 10,523,172 | B2 | 12/2019 | Shaya et al. |
| 11,264,044 | B2* | 3/2022 | Delcroix ................ G10L 15/20 |
| 11,513,216 | B1* | 11/2022 | Kamath Koteshwara .................. G01S 7/52004 |
| 2003/0235318 | A1 | 12/2003 | Bharitkar et al. |
| 2005/0031129 | A1 | 2/2005 | Devantier et al. |
| 2005/0195984 | A1 | 9/2005 | Miura et al. |
| 2005/0207592 | A1 | 9/2005 | Sporer et al. |
| 2006/0153391 | A1 | 7/2006 | Hooley et al. |
| 2007/0025557 | A1 | 2/2007 | Nackvi |
| 2008/0075303 | A1* | 3/2008 | Kim ...................... G10H 1/125 381/103 |
| 2008/0219470 | A1 | 9/2008 | Kimijima |
| 2009/0110218 | A1 | 4/2009 | Swain |
| 2011/0103590 | A1 | 5/2011 | Christoph |
| 2011/0163972 | A1 | 7/2011 | Anzures et al. |
| 2012/0183165 | A1 | 7/2012 | Foo et al. |
| 2013/0064042 | A1 | 3/2013 | Aarts et al. |
| 2013/0216071 | A1 | 8/2013 | Maher et al. |
| 2013/0346559 | A1 | 12/2013 | Van Erven et al. |
| 2014/0003635 | A1 | 1/2014 | Mohammad et al. |
| 2014/0064492 | A1 | 3/2014 | Lakkundi et al. |
| 2014/0185852 | A1 | 7/2014 | Pereira |
| 2014/0274212 | A1 | 9/2014 | Zurek et al. |
| 2015/0163616 | A1 | 6/2015 | Chatterjee |
| 2015/0289076 | A1 | 10/2015 | Zhu et al. |
| 2015/0341729 | A1 | 11/2015 | Meskens et al. |
| 2016/0029142 | A1 | 1/2016 | Isaac |
| 2016/0219392 | A1 | 7/2016 | Vilermo et al. |
| 2016/0315384 | A1 | 10/2016 | van Erven et al. |
| 2016/0366517 | A1 | 12/2016 | Chandran et al. |
| 2017/0025873 | A1 | 1/2017 | Fathollahi |
| 2017/0041445 | A1 | 2/2017 | Ukai et al. |
| 2017/0123755 | A1 | 5/2017 | Hersh et al. |
| 2017/0188167 | A1 | 6/2017 | Li et al. |
| 2017/0280223 | A1 | 9/2017 | Cavarra et al. |
| 2017/0295440 | A1 | 10/2017 | Gran et al. |
| 2018/0063626 | A1 | 3/2018 | Pong et al. |
| 2018/0098167 | A1 | 4/2018 | Welch et al. |
| 2018/0364901 | A1 | 12/2018 | Fan |
| 2019/0075414 | A1 | 3/2019 | Bush |
| 2021/0294845 | A1* | 9/2021 | Bharitkar .............. G06F 16/683 |

FOREIGN PATENT DOCUMENTS

| | | |
|---|---|---|
| CN | 104898970 A | 9/2015 |
| CN | 105224280 A | 1/2016 |
| CN | 105260071 A | 1/2016 |
| CN | 105867766 A | 8/2016 |
| CN | 106708403 A | 5/2017 |
| EP | 0 772 374 A2 | 5/1997 |
| EP | 2 567 554 A1 | 3/2013 |
| EP | 2 986 034 A1 | 2/2016 |
| WO | WO-2011/139502 A1 | 1/2011 |
| WO | WO-2012/040363 A1 | 3/2012 |
| WO | WO-2014/036121 A1 | 3/2014 |
| WO | WO-2018/026799 A1 | 2/2018 |

OTHER PUBLICATIONS

Welcome to REW (2004-2020). Retreived from the Internet at: <URL:https://www.roomeqwizard.com/betahelp/help_en-GB/html/welcome.html>.
Trinnov Audio (2021). Retreived from the Internet at: <URL:https://www.trinnov.com/>.
Sony, "help Guide; Multi Channel AV ReceiversTR-DH750/STR-DH550," (2014). Retreived from the Internet at: <URL:https://helpguide.sony.net/ha/strdh7555/v1/en/contents/TP0000299119.html>.
Pioneer, "What is MCACC?," (2021). Retreived from the Internet at: <URL:https://www.pioneerhomeusa.com/mcacc/>.
Jan Abildgaard Pedersen, "Adjusting a Loudspeaker to Its Acoustic Environment—The ABC System," Audio Engineer Society Convention Paper 5880 (Oct. 10-13, 2003).
International Search Report and Written Opinion for Application No. PCT/US2018/045703, dated Nov. 14, 2019.
International Search Report and Written Opinion for Application No. PCT/US2018/042345, dated Dec. 21, 2018.
International Preliminary Report on Patentability for Application No. PCT/US2018/042345, dated Apr. 8, 2020.
Excerpts from Morfey, Christopher L., Dictionary of Acoustics (2001).
Excerpts from Andrew Tanenbaum, Computer Networks (4th ed. 2003).
DIRAC Live, "Play or Record your favorite music. Experience music as it is intended," (2021). Retreived from the Internet at: <URL:https://live.dirac.com/>.

(56) References Cited

OTHER PUBLICATIONS

Creative, "Creative Unveils the World's First Self-Calibrating Wireless Speaker System—the Creative D5xm™ Intelligent Wireless Speakers," (2021). Retreived from the Internet at: <URL:https://sg.creative.com/corporate/pressroom?id=13359>.
Bose, "Bose Soundbar 500," (2021). Retreived from the Internet at: <URL:https://www.bose.com/en_us/support/articles/HC1971/productCodes/bose_soundbar_500/article.html>.
BeoLab 5 Guide Retreived from the Internet at: <URL:https://content.abt.com/documents/6163/BeoLab5_om.pdf>.
Anthem, "Current Products—Room Correction—Anthem Room Correction," (2021). Retreived from the Internet at: <URL:https://www.anthemav.com/products-current/series=arc/type=room-correction>.
"What is Audyssey MultEQ XT?" (2021). Retreived from the Internet at: <URL:https://denon.custhelp.com/app/answers/detail/a_id/32/~/audyssey-multeq-xt>.
Google LLC, International Preliminary Report on Patentability, PCT/US2018/042345, dated Apr. 8, 2020, 13 pgs.
Notification of Second Office Action for Chinese Application No. 201980053721.X, dated Jan. 27, 2022.
Office Action for European Application No. 18753503.4, dated Jul. 13, 2022.
First Examination Report for India Application No. 201947047310, dated Oct. 8, 2021.
Notification of First Office Action for Chinese Application No. 201980053721.X, dated Aug. 23, 2021.

\* cited by examiner

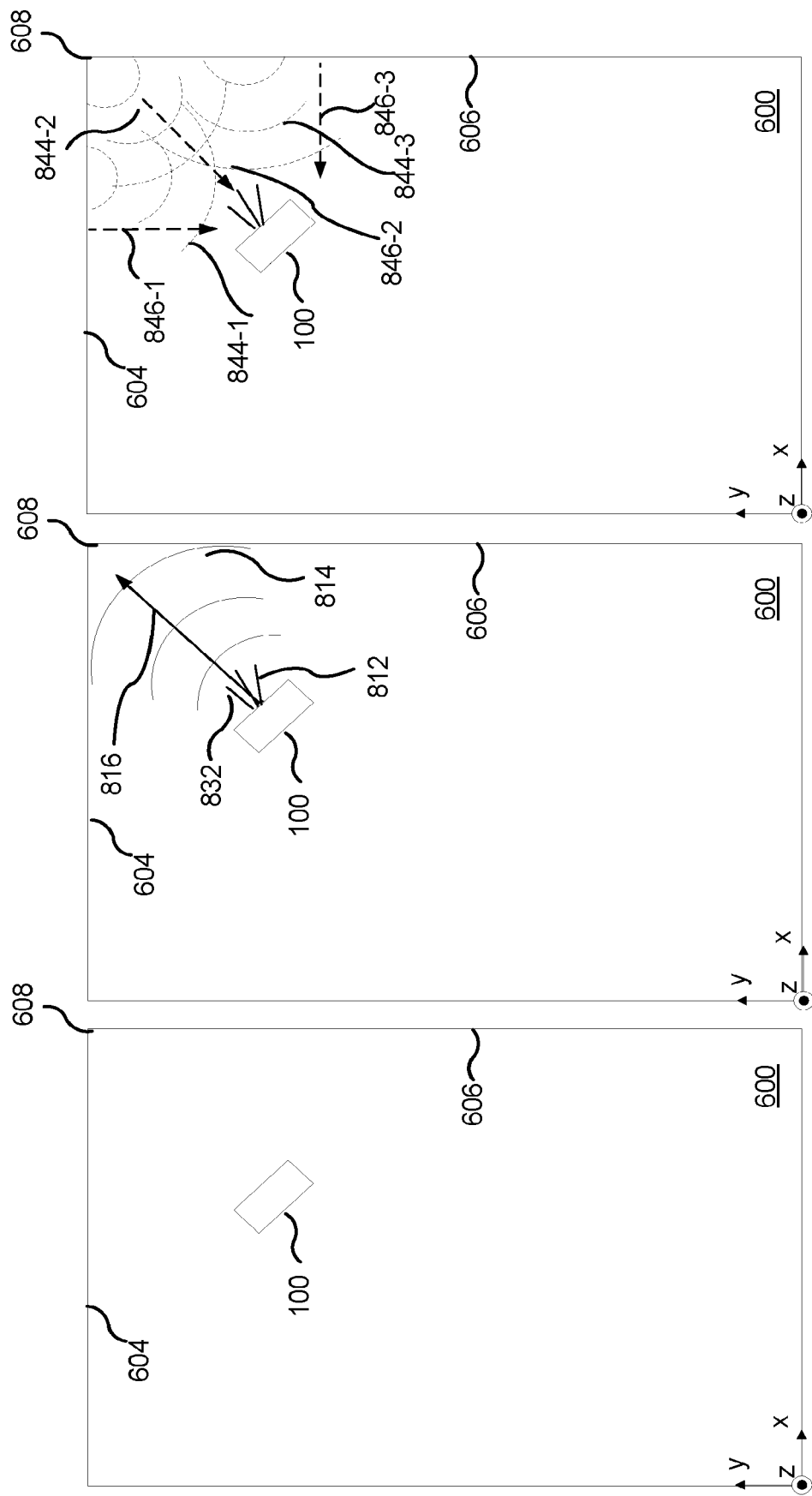

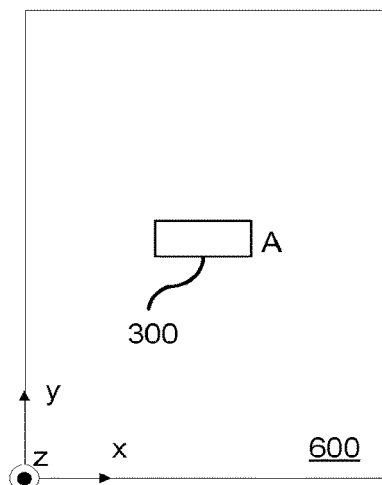
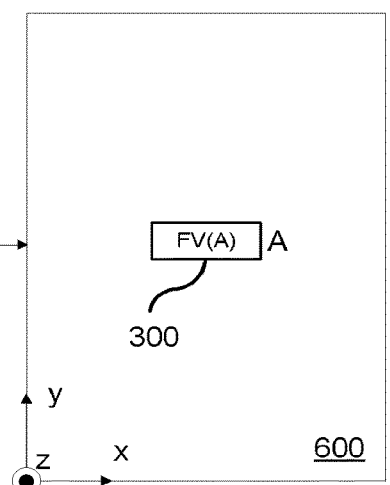
Figure 9A
Figure 9B
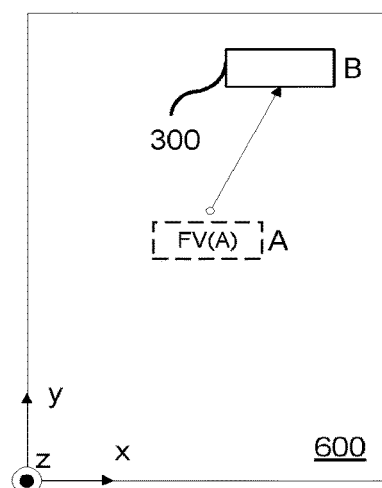
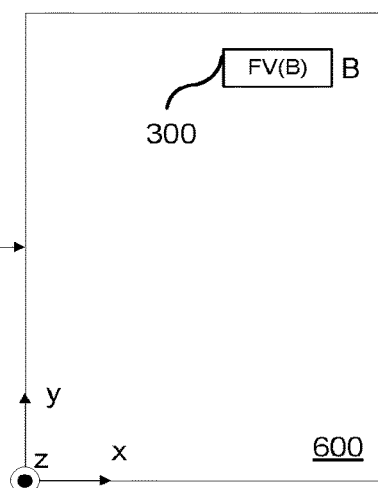
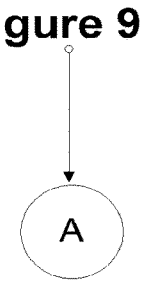
Figure 9C
Figure 9D
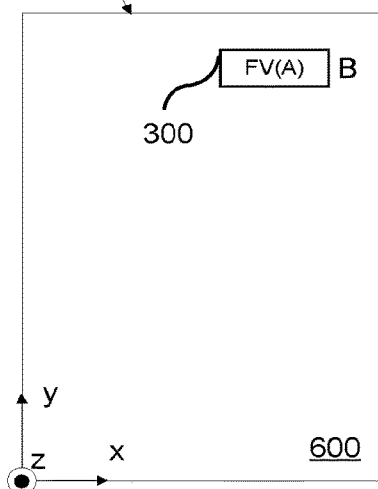
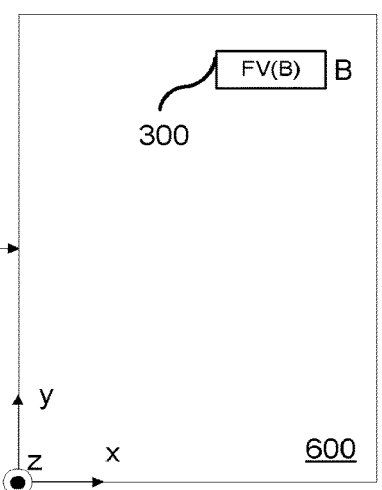
Figure 9E
Figure 9F Correction Database 352

| Feature Vectors | Corrections |
|---|---|
| $\alpha_{11}FV_{11} + \alpha_{12}FV_{12} + ... + \alpha_{1N}FV_{1N}$ | $[C_{11}(f_{0\text{-}10}), C_{12}(f_{11\text{-}30}), ..., C_{1X}(f_{M\text{-}N})]$ |
| ⋮ | ⋮ |
| $\alpha_{p1}FV_{p1} + \alpha_{p2}FV_{p2} + ... + \alpha_{pN}FV_{pN}$ | $[C_{p1}(f_{0\text{-}10}), C_{p2}(f_{11\text{-}30}), ..., C_{pX}(f_{M\text{-}N})]$ |

Feature Vector 1414-1

$$FV_{11} = (\Delta\phi_{f1}, \Delta\phi_{f2}, ..., \Delta\phi_{fn})$$

Figure 14B

METHODS AND SYSTEMS FOR AUTOMATICALLY EQUALIZING AUDIO OUTPUT BASED ON ROOM POSITION

CROSS-REFERENCE TO RELATED APPLICATIONS

This application is a continuation of U.S. patent application Ser. No. 16/719,847, filed Dec. 18, 2019, which is a continuation of U.S. patent application Ser. No. 16/058,885 (now U.S. Pat. No. 10,523,172), filed Aug. 8, 2018, which claims priority to U.S. Provisional Patent Application No. 62/568,216, filed Oct. 4, 2017, and claims priority to U.S. Provisional Patent Application No. 62/568,219, filed Oct. 4, 2017, all of which are incorporated by reference herein in their entireties.

This application is related to U.S. patent application Ser. No. 16/058,820 (now U.S. Pat. No. 10,734,963), filed Aug. 8, 2018, and U.S. Pat. No. 6,731,760, each of which is incorporated by reference herein in its entirety.

FIELD

This relates generally to audio equalization, including but not limited to methods and systems for automatic audio equalization not requiring user action.

BACKGROUND

Electronic devices integrated with microphones and speakers have been widely used to collect voice inputs from users and to output sound (e.g., music and speech). The quality of the audio output can be affected by factors such as room environment and the placement of the speakers in the room. Manual audio equalization, a process in which the gain (response) for different frequencies of the audio output is adjusted, is commonly used to improve the quality of the output sound. However, manual equalization is a cumbersome and time consuming task for the user. Moreover, it requires a lot of knowledge about speakers, microphones, and rooms, which is too advanced for the average user.

Accordingly, there is a need for users to be able to experience high quality audio without requiring time and effort of the user or a detailed knowledge of speakers, microphones, and audio equalization processes. It is desirable for an electronic device to be able to perform audio equalization automatically, independent of any user interaction.

SUMMARY

There is a need for methods, devices, and systems for automatic audio equalization. Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to automatically (without user inputs) equalize audio output.

Audio devices, including electronic devices integrated with microphones and speakers, are widely used to collect voice inputs from users and to output sound such as music or speech. The output audio quality, and accordingly a user's listening experience, can be affected by factors such as the style of the room and the placement of the device/speakers in the room. For example, rooms with hard surfaces suffer from noticeable echo problems. The placement of a speaker at or near a boundary such as on the floor or next to a wall reinforces low frequency tones and can lead to a "boomy" bass. Thus, in order to achieve consistent output audio quality, equalization (e.g., correction) of bass frequencies is needed to counteract the influence of the room and placement.

Manual room equalization is typically a cumbersome process that must be repeated each time the room or placement changes. A user must have a microphone and has to record audio output responses at various positions in a room using the microphone. The user must then apply the required correction based on the collected responses. Furthermore, this manual equalization process requires a lot of knowledge about speakers, microphones, and rooms, which is too advanced for the average user. Automatic audio equalization provides an opportunity for users to achieve the best listening experience and at the same time, avoid the need for any setup or calibration process. Moreover, an automatic equalization process enables a user to rearrange the room or move the speakers without having to worry about conducting another tiresome manual equalization.

There is a need to adjust a frequency response or equalization of the signal driving a speaker device to make it sound consistent whether it is placed in the open, or near a wall, or in a corner.

Some methods of equalization use a microphone placed directly in front of the speaker (e.g., in two positions in front of the speaker). A formula is provided for estimating acoustic radiation resistance, as a function of frequency, which correlates with how much power the speaker couples into the room, so it can be used to estimate a compensating equalization when reflections from a wall cause an increase in radiation resistance at low frequencies. However, a manual approach with external microphones is not a viable solution in some circumstances.

In accordance with some implementations, this adjustment is performed using microphones within the speaker device. This avoids the need for any setup or calibration process, or remote sensors.

In accordance with some implementations, an automated equalization method uses microphones on top of a speaker, one near the front of the speaker and one near the back of the speaker, to sense the relative contributions of a wave traveling from the speaker toward the wall(s) behind and any waves reflected from those walls. In some instances and implementations, at low enough frequency (e.g., where the wavelength is long compared to the round trip distance to the reflectors), a certain delay, or phase shift, from a wave directly from the speaker is anticipated between the microphones; and a reduction of that delay or phase shift is anticipated between the microphones for a wave reflecting off the wall(s) behind the speaker.

At higher frequencies, the effect of the reflection is more complicated, but with patterns that can be learned and recognized to retrieve a good equalization for each position. Therefore, in accordance with some implementations, when playing music, an automated equalization method measures the relative phases, using the music as stimulus, and performs some frequency analysis to estimate the phase pattern features.

In some implementations, the electronic device includes a pair of microphones that are located on the sides of a speaker (e.g., in addition to microphones on a top of the speaker device). In some implementations, the device comprises multiple pairs of microphones with front-back separation. In some implementation, the multiple pairs of microphones are located on both the top and the sides of the speaker(s). In some implementations, the microphones are only on the body of the speaker, away from the drivers, not out in front. In some implementations, the microphones internal to the speaker device. For example, the microphones and the speakers are components of a same electronic device. In some implementations, the microphones are in internal positions where they are also useful for other functions such as speech recognition (e.g., in a voice-enabled smart speaker). In some implementations, the microphones are positioned to capture audio from one or more persons in the vicinity of the speaker device.

In some implementations, the system performs audio equalization based on user content (e.g., music) output of the speaker rather than requiring a test signal (e.g., no beeps or sweep tones). In some implementations, phase shifts in received audio output are measured using one or more pairs of microphones. In some implementations, the relative phase (phase difference) between one or more pairs of microphones is measured. In some implementations, the frequency (acoustic) response is determined using relative amplitude spectral features. In some implementations, relative amplitude spectral features are used in combination with microphone matching and/or calibration. In some instances and implementations, giving weight the phase differences minimizes the impact of differences in sensitivities between the microphones on the equalization process. In some implementations, equalization comprises correcting the frequency response at below a threshold frequency (e.g., below about 300 Hz, where the wavelength is about 1.1 m). In some instances and implementations, only the frequencies below the threshold frequency propagate in all directions, including backwards, from a speaker, and therefore are the only frequencies impacted by walls or corners behind the speaker.

In some implementations, the relative positioning of the microphones with respect to one another is obtained and used to determine phase differences. In some implementations, the automatic equalization is performed without any information regarding relative positioning of the microphones with respect to the speaker(s).

In some implementations, the automatic equalization is carried out based on an acoustical model. In some implementations, the device learns and recognizes patterns based on room position, and applies a corresponding equalization correction.

In some implementations, the automatic equalization is carried out using machine learning. In some implementations, machine learning comprises training the device on desired corrections for a range of positions and/or frequencies (e.g., training targets can be obtained from expert listeners, or by measuring the spectrum at auxiliary microphones in the listening area, or by the ABC method using auxiliary microphones in front of the speaker driver). In some implementations, a nearest neighbor classifier algorithm is used to identify the appropriate correction (e.g., with phases estimated at frequencies in the 50-300 Hz range as the feature vector). In some implementations, a nonlinear logistic regression such as a multilayer neural network with sigmoidal output is used to identify the appropriate correction. In some implementations, utilizing machine learning enables corrections for many positions and reflecting materials. In some implementations, other machine learning methods are utilized.

As described previously, room equalization is normally cumbersome to set up for the user. Typically the user has to perform acoustic measurements using a microphone (in for instance a smartphone) to capture measurement signals in various locations in a room.

In some implementations, by using multiple electronic devices (e.g., a cluster of audio assistant products) located at different positions of a room, one speaker of one electronic device at a time is used to generate an acoustic signal, and microphones of the other electronic devices are used to capture respective acoustic responses at the respective positions of the room. In some implementations, information about the acoustic transfer function of a room is automatically captured by enabling each speaker to generate acoustic stimulus. In some implementations, the room response data are processed on a server system (e.g., in the cloud) using machine learning algorithms to generate a room equalization curve. In some implementations, the generated room equalization curve is downloaded to the electronic device, thus improving the in-room frequency response without user interaction.

In one aspect, some implementations include a method for equalizing audio output performed at an electronic device having one or more speakers, a plurality of microphones, one or more processors, and memory. The method includes: (1) outputting audio user content from the one or more speakers located in a room; and (2) automatically and without user input, equalizing subsequent audio output of the electronic device, the equalizing including: (a) obtaining a collection of audio content signals, including receiving the outputted audio content at each microphone of the plurality of microphones; (b) determining from the collection of audio content signals a plurality of phase differences (e.g., transfer functions) between microphones of the plurality microphones; (c) obtaining a feature vector based on the plurality of phase differences; (d) obtaining a frequency correction (e.g., frequency correction curve) from a correction database based on the obtained feature vector; and (e) applying the obtained frequency correction to the subsequent audio output. In some implementations, the method further includes determining one or more phase differences between the outputted audio content and received audio content at one or more of the microphones. In some implementations, the plurality of microphones is positioned so as to be near-field with one another.

In another aspect, some implementations include a method of generating a correction database. The method includes: for each position of a plurality of positions within a plurality of rooms: (1) positioning a speaker device at the position; (2) outputting via the speaker device training audio; (3) receiving the outputted training audio at two or more microphones; (4) generating a reference feature vector and reference frequency correction based on the outputted training audio; and (5) adding the reference feature vector and reference frequency correction to the correction database.

In another aspect, some implementations include a method of equalizing audio output performed at a computing system having one or more speakers, a plurality of microphones, one or more processors, and memory. The method includes: (1) outputting audio user content from the one or more speakers located in a room; and (2) automatically and without user input, equalizing an audio output of the computing system, the equalizing including: (a) receiving the outputted audio content at each microphone of the plurality of microphones; (b) based on the received audio content, determining an acoustic transfer function (e.g., impedance) for the room; (c) based on the determined acoustic transfer function, obtaining a frequency response (e.g., room/decibel gain) for the room; and (d) adjusting one or more properties of the speakers based on the determined frequency response. In some implementations, the equalization is performed independent of any specific user request. In some implementations, the equalization is performed without requiring any action from the user. In some implementations, the computing system determines its location within the room based on sonar, radar, or via a high-frequency mapping.

In yet another aspect, some implementations include a method for training an equalization neural network. The method includes: (1) generating an audio equalization neural network by, for each position of a plurality of positions within a plurality of rooms: (a) positioning an audio system at the position, the audio system having a plurality of microphones and one or more speakers; (b) outputting one or more audio signals via the one or more speakers; (c) obtaining a collection of audio signals by receiving the outputted one or more audio signals at each of the plurality of microphones; (d) obtaining a feature vector for the position based on the collection of audio signals; and (e) adding one or more nodes corresponding to the feature vector to a neural network; and (2) training the equalization neural network.

In yet another aspect, some implementations include a computing system including one or more processors and memory coupled to the one or more processors, the memory storing one or more programs configured to be executed by the one or more processors, the one or more programs including instructions for performing any of the methods described herein.

In yet another aspect, some implementations include a non-transitory computer-readable storage medium storing one or more programs for execution by one or more processors of a computing system, the one or more programs including instructions for performing any of the methods described herein.

Thus, devices, storage mediums, and computing systems are provided with methods for automatic audio equalization, thereby increasing the effectiveness, efficiency, and user satisfaction with such systems. Such methods may complement or replace conventional methods for audio equalization.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

FIGS. 8D-8F are plan views illustrating an example operating sequence of the electronic device positioned in FIG. 8B, in accordance with some implementation.

FIGS. 9A-9H illustrate example responses of the electronic device of FIG. 3A in various locations in a room, in accordance with some implementations.

FIGS. 14A-14B illustrate an example correction database at the electronic device, in accordance with some implementations.

Like reference numerals refer to corresponding parts throughout the several views of the drawings.

DETAILED DESCRIPTION

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Electronic devices integrated with microphones and speakers are configured to receive and output sound. The sound output by these devices can be substantially affected by their placement in a listening room. For example, the bass frequencies of sound output by electronic devices can be substantially boosted as perceived by a listener depending on a number of nearby reflecting surfaces in a listening room (e.g., nearby furniture, walls, or ceiling). In some listening environments and/or for some audio content played on a speaker, distortion of sound output by electronic devices caused by room effects results in a less than ideal listening experience. In some implementations, these electronic devices are further configured to perform automatic audio equalization to correct for room effects on their output sound. In some implementations, the electronic devices correct for room effects through analysis of sound received by one or more microphones in the listening environment, independent of any user interaction, and thus enable a user to enjoy a high quality listening experience at any location with convenience and ease. In some implementations, the microphones employed for this purpose are microphones provided by the electronic device that is a source of the output sound to be equalized. In some implementations, the microphones employed for this purpose are microphones provided by other electronic devices in the listening environment.

Automatic equalization takes into account factors such as room and device positions. The speakers output audio which is collected by the microphones. From the collected audio, information including phase(s), phase difference(s), and the audio frequency response are determined. Using the determined information, the corresponding equalization correction is generated by either the electronic device (e.g., using a correction database available locally on the device) or at a server. Finally, the equalization correction is applied automatically and without user input to the electronic device.

Figure 1B:
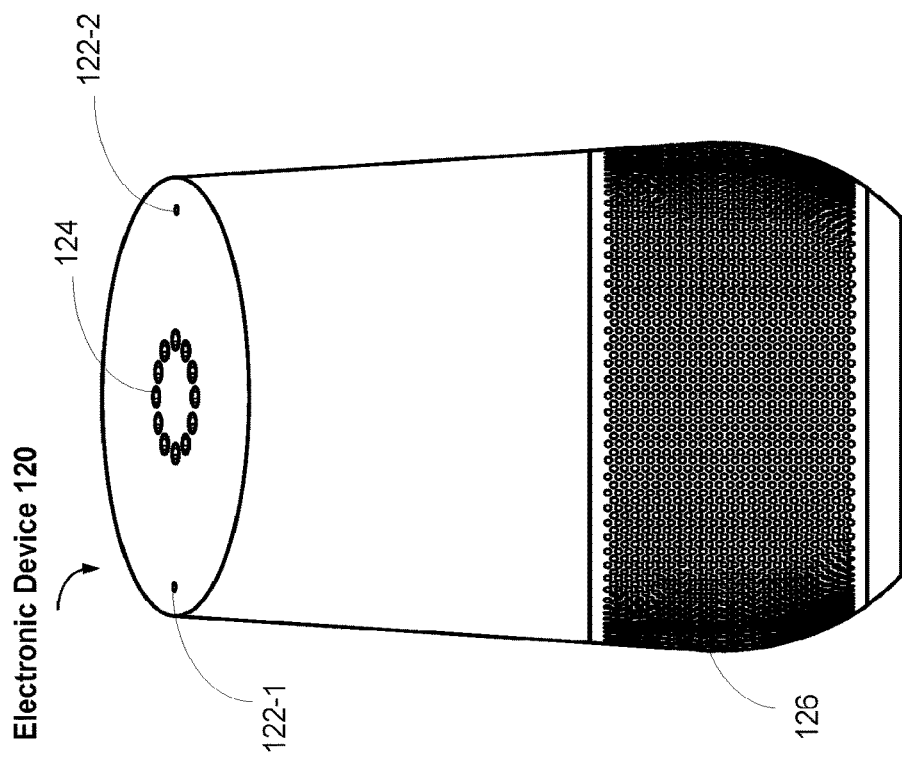
FIGS. 1A and 1B illustrate representative electronic devices for automatic audio equalization, in accordance with some implementations.
Figure 1A:
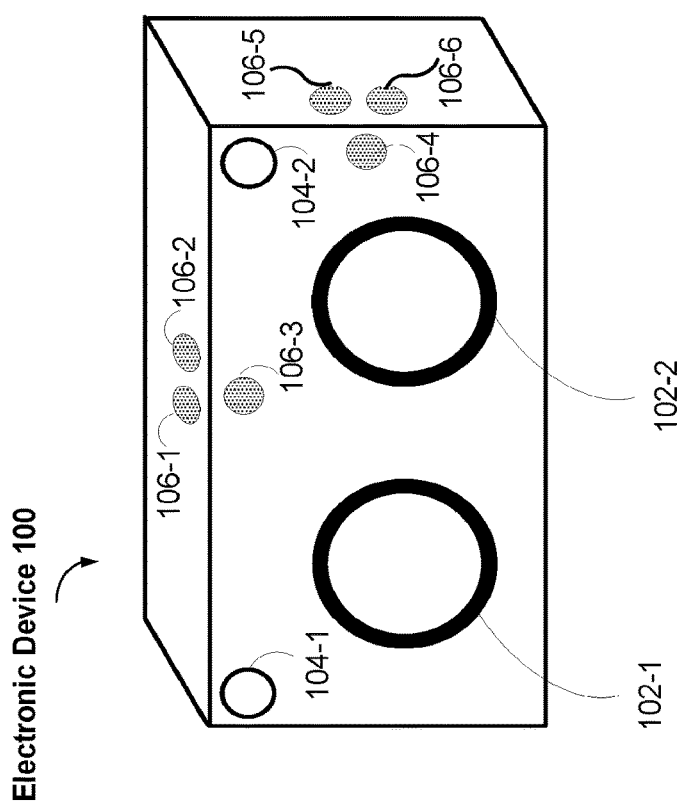

FIG. 1A illustrates an electronic device 100 for automatic audio equalization, in accordance with some implementations. The electronic device 100 includes one or more bass speakers 102 (e.g., 102-1 and 102-2), one or more tweeter speakers 104, and multiple microphones 106. In some implementations, speakers 102 include different types of speakers, e.g., low-frequency bass speakers and high-frequency treble/tweeter speakers. In some implementations, the electronic device 100 includes three or more speakers 102. In some implementations, the speakers 102 are arranged at different geometries (e.g., in a triangular configuration). In some implementations, the electronic device 100 does not include any tweeter speakers 104. In some implementations, the electronic device 100 includes fewer than six microphones 106. In some implementations, the electronic device 100 includes more than six microphones 106. In some implementations, the microphones 106 include two or more different types of microphones.

In FIG. 1A, the microphones 106 are arranged in groupings of three, where one of the microphones (e.g., the microphone 106-3) is on a front face of the electronic device 100 and the other two microphones (e.g., the microphones 106-1 and 106-2) in the grouping are on a side or top of the device. In some implementations, the microphones 106 are arranged at locations within the electronic device 100 other than the locations shown in FIG. 1A. In some implementations, the microphones 106 are grouped differently on the electronic device 100. For example, the microphones 106 are arranged in groupings of four with one microphone on a front face and one microphone on a back face of the device 100. In some implementations, the microphones 106 are oriented and/or positioned relative to the speakers 102. For example, one microphone (e.g., 106-3) faces the same direction as the speakers 102 and the other microphones (e.g., 106-1 and 106-2) are perpendicular (or generally perpendicular) to the direction of the speakers 102. As another example, one microphone (e.g., 106-3) is positioned closer to the speakers 102 than the other microphones (e.g., 106-1 and 106-2). Therefore, in some implementations, the microphones 106 are positioned such that phase differences are present in received audio and can be analyzed to determine room characteristics.

FIG. 1B illustrates an electronic device 120 for automatic audio equalization, in accordance with some implementations. In some implementations, the electronic device 120 includes microphones 122, an array of illuminators 124 (e.g., LEDs), and one or more speakers that are located behind the mesh 126. Further, the rear side of the electronic device 120 optionally includes a power supply connector configured to couple to a power supply (not shown). In some implementations, the electronic device 120 includes more or less microphones 122 than shown in FIG. 1B. In some implementations, the microphones 122 are arranged at locations within the electronic device 120 other than the locations shown in FIG. 1B.

In some implementations, the electronic device 100 and/or the electronic device 120 are voice-activated. In some implementations, the electronic device 100 and/or the electronic device 120 present a clean look having no visible button, and the interaction with the electronic device 120 is based on voice and touch gestures. Alternatively, in some implementations, the electronic device 100 and/or the electronic device 120 include a limited number of physical buttons (not shown), and the interaction with the electronic device is further based on presses of the button in addition to the voice and/or touch gestures.

Figure 2:
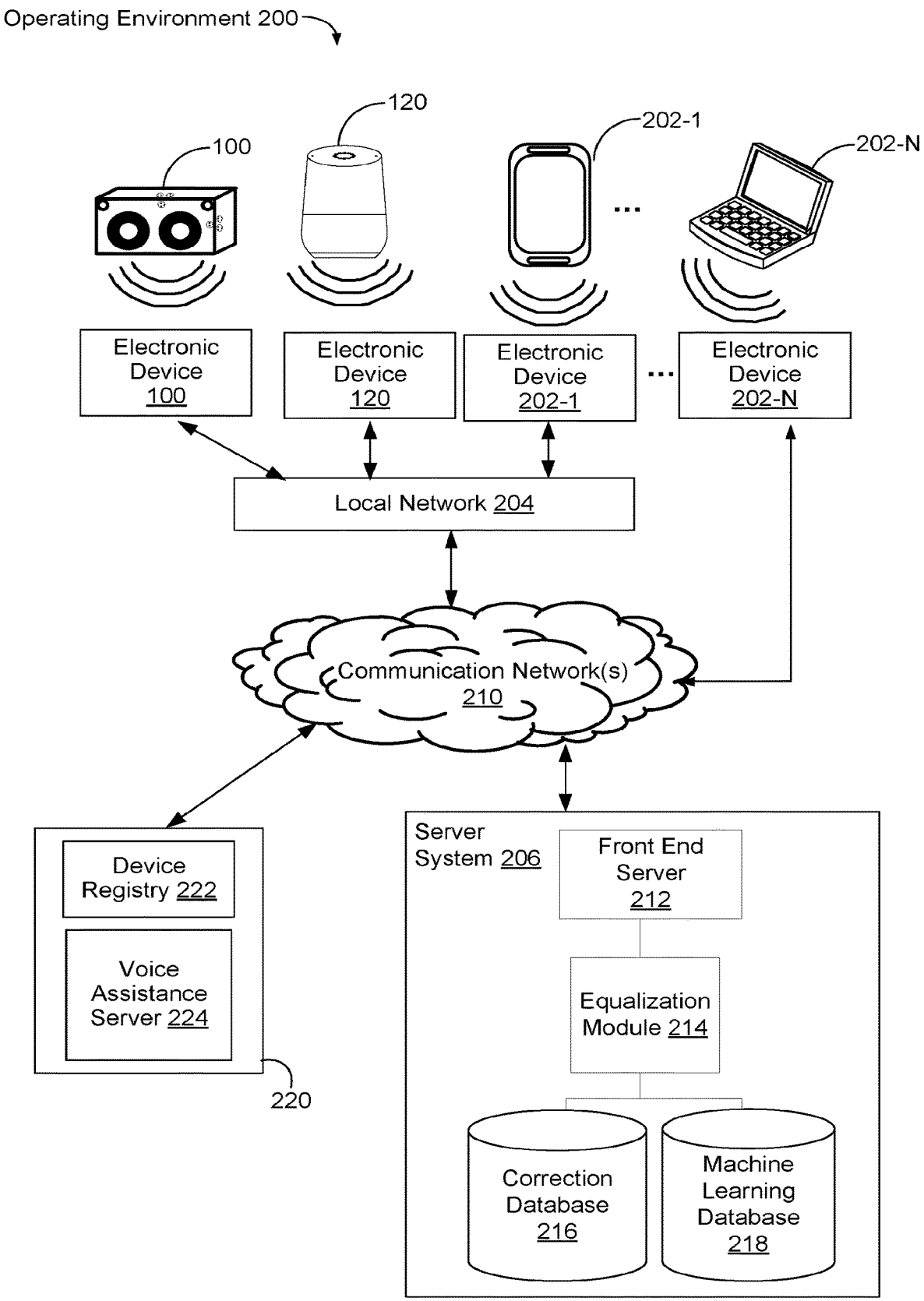
FIG. 2 is a block diagram illustrating a representative operating environment that includes a plurality of electronic devices and a server system, in accordance with some implementations.

FIG. 2 is a block diagram illustrating a operating environment 200 that includes a plurality of electronic devices 100, 120, and 202, and server systems 206, 220, in accordance with some implementations. The operating environment includes one or more electronic devices 100, 120, and 202 which are located at one or more positions within a defined space, e.g., in a single room or space of a structure, or within a defined area of an open space.

Examples of an electronic device 202 include the electronic device 100, the electronic device 120, a handheld computer, a wearable computing device, a personal digital assistant (PDA), a tablet computer, a laptop computer, a desktop computer, a cellular telephone, a smart phone, a voice-activated device, an enhanced general packet radio service (EGPRS) mobile phone, a media player, or a combination of any two or more of these data processing devices or other data processing devices.

In accordance with some implementations, the electronic devices 100, 120, and 202 are communicatively coupled through communication network(s) 210 to a server system 206 and a smart assistant system 220. In some implementations, at least some of the electronic devices (e.g., devices 100, 120, and 202-1) are communicatively coupled to a local network 204, which is communicatively coupled to the communication network(s) 210. In some implementations, the local network 204 is a local area network implemented at a network interface (e.g., a router). In some implementations, the electronic devices 100, 120, and 202 that are communicatively coupled to the local network 204 also communicate with one another through the local network 204. In some implementations, the electronic devices 100, 120, and 202 are communicatively coupled to one another (e.g., without going through the local network 204 or the communication network(s) 210).

Optionally, one or more of the electronic devices are communicatively coupled to the communication networks 210 and are not on the local network 204 (e.g., electronic device 202-N). For example, these electronic devices are not on the Wi-Fi network corresponding to the local network 204 but are connected to the communication networks 210 through a cellular connection. In some implementations, communication between electronic devices 100, 120, and 202 that are on the local network 204 and electronic devices 100, 120, and 202 that are not on the local network 204 is performed through the voice assistance server 224. In some implementations, the electronic devices 202 are registered in a device registry 222 and thus known to the voice assistance server 224.

In some implementations, the server system 206 includes a front end server 212 that facilitates communication between the server system 206 and electronic devices 100, 120, and 202 via the communication network(s) 210. For example, the front end server 212 receives audio content (e.g., the audio content is music and/or speech) from the electronic devices 202. In some implementations, the front end server 212 is configured to send information to the electronic devices 202. In some implementations, the front end server 212 is configured to send equalization information (e.g., frequency corrections). For example, the front end server 212 sends equalization information to the electronic devices in response to received audio content. In some implementations, the front end server 212 is configured to send data and/or hyperlinks to the electronic devices 100, 120, and/or 202. For example, the front end server 212 is configured to send updates (e.g., database updates) to the electronic devices.

In some implementations, the server system 206 includes an equalization module 214 that determines from the audio signals collected from the electronic devices 202 information about the audio signals, such as frequencies, phase differences, transfer functions, feature vectors, frequency responses etc. In some implementations, the equalization module 214 obtains frequency correction data from the correction database 216 to be sent to the electronic device (e.g., via the front end server 212). In some implementations, the frequency correction data is based on information about the audio signals. In some implementations, the equalization module 214 applies machine learning (e.g., in conjunction with a machine learning database 218) to the audio signals to generate a frequency correction.

In some implementations, the server system 206 includes a correction database 216 that stores frequency correction information. For example, the correction database 216 includes pairings of audio feature vectors and corresponding frequency corrections.

In some implementations, the server system 206 includes a machine learning database 218 that stores machine learning information. In some implementations, the machine learning database 218 is a distributed database. In some implementations, the machine learning database 218 includes a deep neural network database. In some implementations, the machine learning database 218 includes supervised training and/or reinforcement training databases.

Figure 3A:
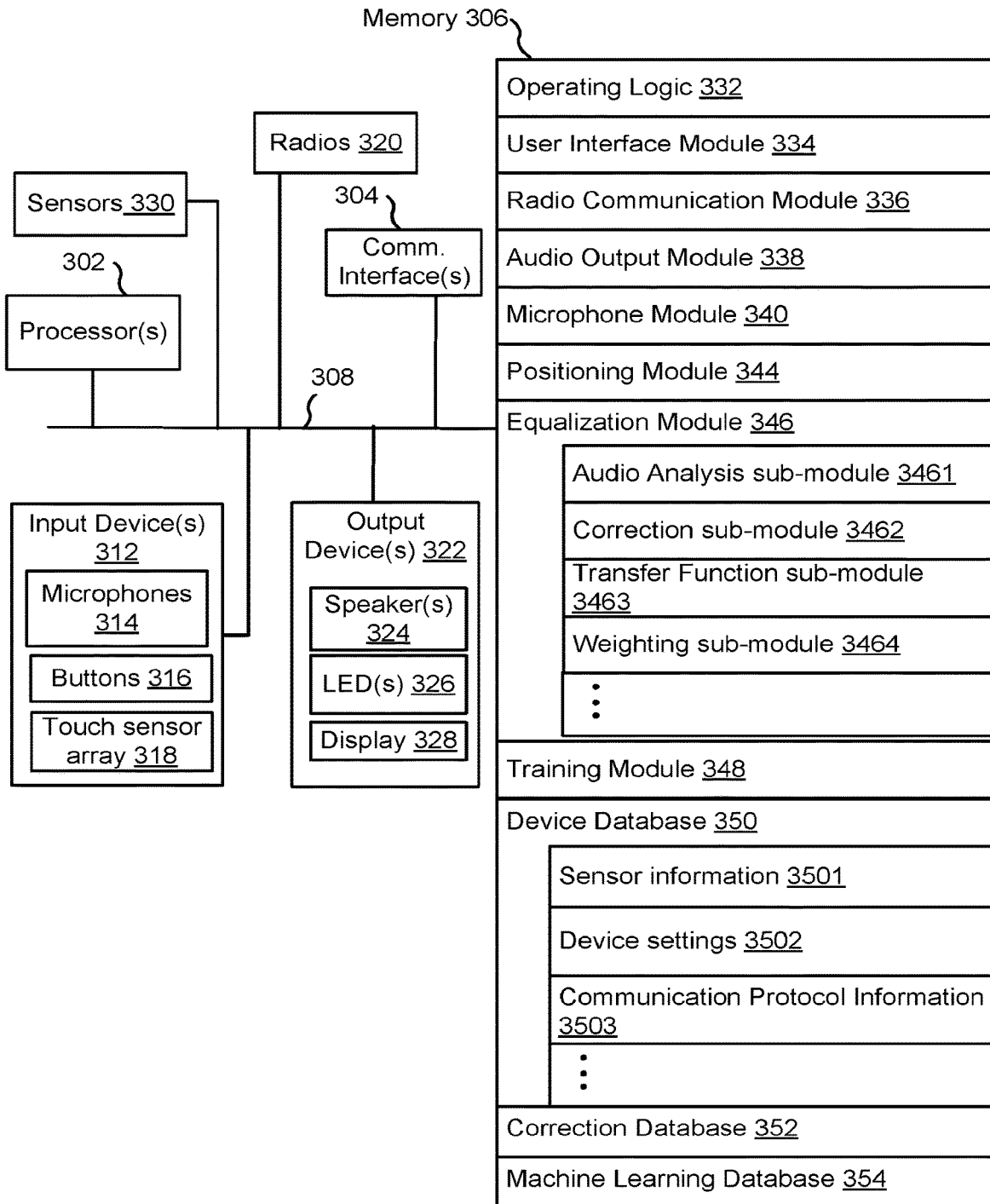
FIG. 3A is a block diagram illustrating a representative electronic device, in accordance with some implementations.

FIG. 3A is a block diagram illustrating an electronic device 300, in accordance with some implementations. In some implementations, the electronic device 300 is, or includes, any of the electronic devices 100, 120, 202 of FIG. 2. The electronic device 300 includes one or more processor(s) 302, one or more network interface(s) 304, memory 306, and one or more communication buses 308 for interconnecting these components (sometimes called a chipset).

In some implementations, the electronic device 300 includes one or more input devices 312 that facilitate audio input and/or user input, such as microphones 314, buttons 316, and a touch sensor array 318. In some implementations, the microphones 314 include the microphones 106, the microphones 122, and/or other microphones.

In some implementations, the electronic device 300 includes one or more output devices 322 that facilitate audio output and/or visual output, including one or more speakers 324, LEDs 326, and a display 328. In some implementations, the LEDs 326 include the illuminators 124 and/or other LEDs. In some implementations, the speakers 324 include the bass speakers 102, the tweeter speakers 104, the speakers of device 120, and/or other speakers.

In some implementations, the electronic device 300 includes radios 320 and one or more sensors 330. The radios 320 enable one or more communication networks, and allow the electronic device 300 to communicate with other devices. In some implementations, the radios 320 are capable of data communications using any of a variety of custom or standard wireless protocols (e.g., IEEE 802.15.4, Wi-Fi, ZigBee, 6LoWPAN, Thread, Z-Wave, Bluetooth Smart, ISA100.5A, WirelessHART, MiWi, etc.) custom or standard wired protocols (e.g., Ethernet, HomePlug, etc.), and/or any other suitable communication protocol, including communication protocols not yet developed as of the filing date of this document.

In some implementations, the sensors 330 include one or more movement sensors (e.g., accelerometers), light sensors, positioning sensors (e.g., GPS), and/or audio sensors. In some implementations, the positioning sensors include one or more location sensors (e.g., passive infrared (PIR) sensors) and/or one or more orientation sensors (e.g., gyroscopes).

Figure 3B:
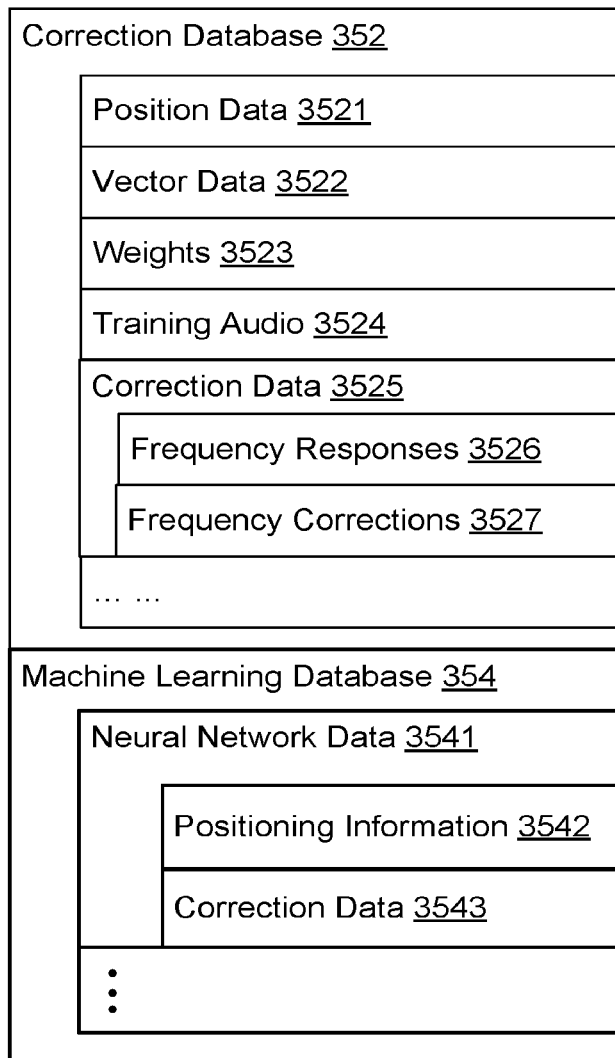
FIG. 3B is a block diagram illustrating sub-modules of the correction database and machine learning database of the electronic device in FIG. 3A, in accordance with some implementations.

The memory 306 includes high-speed random access memory, such as DRAM, SRAM, DDR RAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 306, optionally, includes one or more storage devices remotely located from one or more processor(s) 302. The memory 306, or alternatively the non-volatile memory within the memory 306, includes a non-transitory computer-readable storage medium. In some implementations, the memory 306, or the non-transitory computer-readable storage medium of the memory 306, stores the following programs, modules, and data structures, or a subset or superset thereof:

operating logic 332 including procedures for handling various basic system services and for performing hardware dependent tasks;

a user interface module 334 for providing and displaying a user interface in which settings, captured data including hotwords, and/or other data for one or more devices (e.g., the electronic device 300 and/or other devices) can be configured and/or viewed;

a radio communication module 336 for connecting to and communicating with other network devices (e.g., local network 204, such as a router that provides Internet connectivity, networked storage devices, network routing devices, server system 206, smart home server system 220 etc.) coupled to one or more communication networks 210 via one or more communication interfaces 304 (wired or wireless);

an audio output module 338 for determining and/or presenting audio signals (e.g., in conjunction with the speakers 324);

a microphone module 340 for obtaining and/or analyzing audio signals (e.g., in conjunction with the microphones 314);

a positioning module 344 for obtaining and/or analyzing positioning information (e.g., orientation and/or location information), e.g., in conjunction with the sensors 330;

an equalization module 346 for equalizing audio output of the electronic device 300, including, and not limited to:

an audio analysis sub-module 3461 for analyzing audio signals collected from input devices (e.g., microphones), for example, determining audio properties (e.g., frequencies, phase shifts and/or phase differences) and/or generating fast Fourier transforms (FFTs) of audio frequencies;

a correction sub-module 3462 for obtaining frequency corrections from a correction database 352 and/or applying the frequency corrections to the electronic device 300;

a transfer function sub-module 3463 for determining feature vectors, acoustic transfer functions (relating the audio outputs to the audio inputs), and/or frequency responses of the electronic device 300 using the analyzed audio signals; and a weighting sub-module 3464 for assigning different weights to respective audio signals and/or audio properties (e.g., phase differences and/or signal-to-noise ratios);

a training module 348 for generating and/or training audio models and, optionally, fingerprinting audio events associated with the electronic device 300;

a device database 350, for storing information associated with the electronic device 300, including, and not limited to:

sensor information 3501 associated with the sensors 330;

device settings 3502 for the electronic device 300, such as default options and preferred user settings; and communications protocol information 3503 specifying communication protocols to be used by the electronic device 300;

a correction database 352 for storing frequency correction information as described in greater detail in reference to FIG. 3B; and a machine learning database 354 for storing machine learning information as described in greater detail in reference to FIG. 3B.

FIG. 3B is a block diagram illustrating sub-modules of the correction database 352 and machine learning database 354 of the electronic device 300 in FIG. 3A, in accordance with some implementations. In some implementations, the correction database 352 includes the following datasets or a subset or superset thereof:

position data 3521 corresponding to different locations and/or orientations of associated audio devices (e.g., the positioning of microphones and/or speakers);

vector data 3522 including phase shifts, phase differences, and/or feature vectors corresponding to different positions and/or orientations of associated audio devices;

weight information 3523 including weights assigned to different signal-to-noise ratios, microphones, pairs of microphones, and/or positioning of microphones;

training audio 3524 including training data (e.g., white noise, pink noise, etc.) for use with constructing the correction database 352; and correction data 3525 storing information used to correct audio frequency responses of audio devices, including, and not limited to:

frequency responses 3526 including frequency responses and/or feature vectors corresponding to different locations and/or orientations of audio devices; and frequency corrections 3527 corresponding to respective frequency responses 3526.

As also shown in FIG. 3B, the machine learning database 354 includes, in accordance with some implementations, the following datasets or a subset or superset thereof:

neural network data 3541 including information corresponding to the operation of one or more neural network(s), including, and not limited to:

positioning information 3542 including information (e.g., feature vectors) corresponding to different locations and/or orientations of audio devices; and correction data 3543 corresponding to the positioning information 3542.

Each of the above identified modules are optionally stored in one or more of the memory devices described herein, and corresponds to a set of instructions for performing the functions described above. The above identified modules or programs need not be implemented as separate software programs, procedures, modules or data structures, and thus various subsets of these modules may be combined or otherwise re-arranged in various implementations. In some implementations, the memory 306 stores a subset of the modules and data structures identified above. Furthermore, the memory 306, optionally, stores additional modules and data structures not described above (e.g., module(s) for hotword detection and/or speech recognition in a voice-enabled smart speaker). In some implementations, a subset of the programs, modules, and/or data stored in the memory 306 are stored on and/or executed by the server system 206 and/or the voice assistance server 224.

Figure 4A:
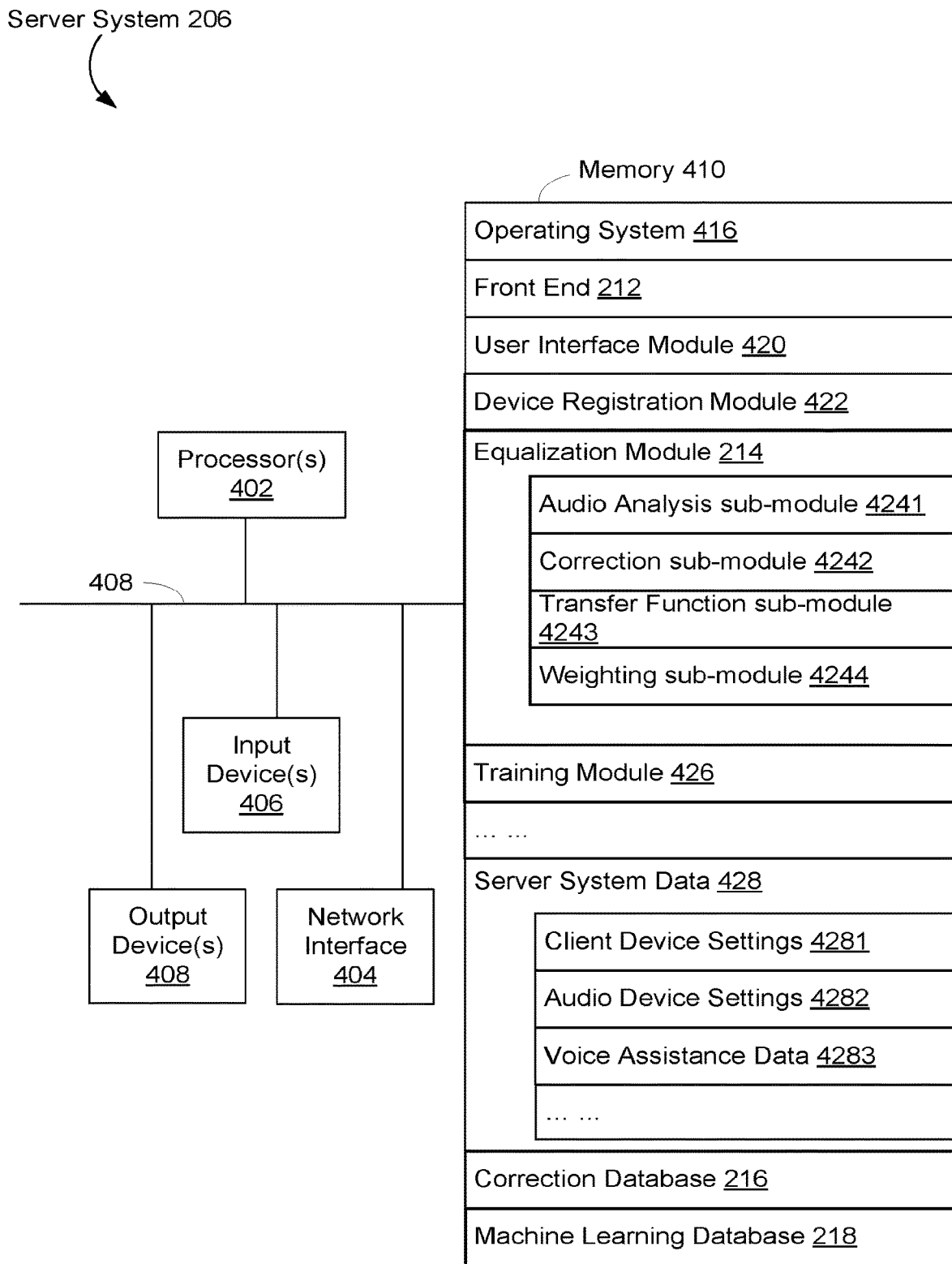
FIG. 4A is a block diagram illustrating a representative server system, in accordance with some implementations.

FIG. 4A is a block diagram illustrating the server system 206, in accordance with some implementations. The server system 206 includes one or more processor(s) 402, one or more network interfaces 404, memory 410, and one or more communication buses 408 for interconnecting these components (sometimes called a chipset), in accordance with some implementations.

The server system 206 optionally includes one or more input devices 406 that facilitate user input, such as a keyboard, a mouse, a voice-command input unit or microphone, a touch screen display, a touch-sensitive input pad, a gesture capturing camera, or other input buttons or controls. In some implementations, the server system 206 optionally uses a microphone and voice recognition or a camera and gesture recognition to supplement or replace the keyboard. The server system 206 optionally includes one or more output devices 408 that enable presentation of user interfaces and display content, such as one or more speakers and/or one or more visual displays.

Figure 4B:
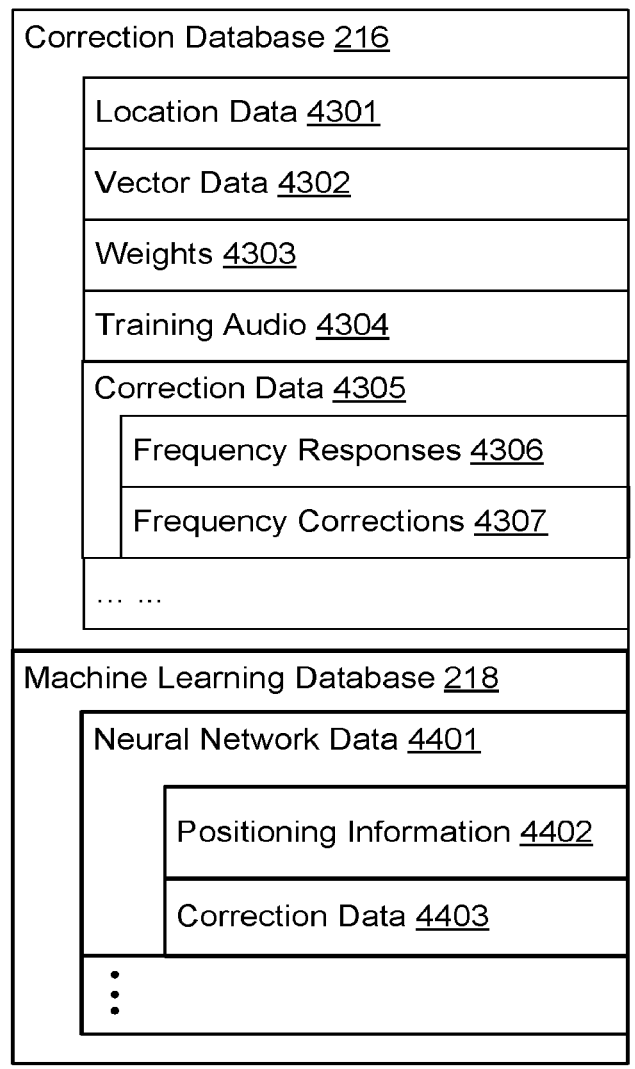
FIG. 4B is a block diagram illustrating sub-modules of the correction database and machine learning database of the server system in FIG. 4A, in accordance with some implementations.

The memory 410 includes high-speed random access memory, such as DRAM, SRAM, DDR RAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 410, optionally, includes one or more storage devices remotely located from the one or more processors 402. The memory 410, or alternatively the non-volatile memory within the memory 410, includes a non-transitory computer-readable storage medium. In some implementations, the memory 410, or the non-transitory computer-readable storage medium of the memory 410, stores the following programs, modules, and data structures, or a subset or superset thereof:

- an operating system 416 including procedures for handling various basic system services and for performing hardware dependent tasks;
- a front end 212 for communicatively coupling the server system 206 to other devices (e.g., electronic devices 100, 120, and 202) via the network interface(s) 404 (wired or wireless) and one or more networks, such as the Internet, other wide area networks, local area networks, metropolitan area networks, and so on;
- a user interface module 420 for enabling presentation of information (e.g., a graphical user interface for presenting application(s), widgets, websites and web pages thereof, games, audio and/or video content, text, etc.) either at the server system or at an electronic device;
- a device registration module 422 for registering devices (e.g., electronic device 300) for use with the server system 206;
- an equalization module 424 for equalizing audio output of an electronic device (e.g., electronic device 300), including, and not limited to:
  - an audio analysis sub-module 4241 for analyzing audio signals received from electronic device(s) (e.g., electronic device 300), for example, determining audio properties (e.g., frequencies, phase shifts and/or phase differences) and/or generating fast Fourier transforms (FFTs) of audio frequencies;
  - a correction sub-module 4242 for obtaining frequency corrections from a correction database 216 and/or applying the frequency corrections to an electronic device 300;
  - a transfer function sub-module 4243 for determining feature vectors, acoustic transfer functions (relating the audio outputs to the audio inputs), and/or frequency responses of an electronic device 300 using the analyzed audio signals; and
  - a weighting sub-module 4244 for assigning different weights to respective audio signals and/or audio properties (e.g., phase differences and/or signal-to-noise ratios);
- a training module 426 for generating and/or training audio models and, optionally, fingerprinting audio events associated with electronic device(s) 300;
- server system data 428 storing data associated with the server system 206, including, but not limited to:
- client device settings 4281 including device settings for one or more electronic devices (e.g., electronic device(s) 300), such as common device settings (e.g., service tier, device model, storage capacity, processing capabilities, communication capabilities, etc.), and information for automatic media display control;
- audio device settings 4282 including audio settings for audio devices associated with the server system 206 (e.g., electronic device(s) 300), such as common and default settings (e.g., volume settings for speakers and/or microphones etc.); and o voice assistance data 4283 for voice-activated devices and/or user accounts of the voice assistance server 224, such as account access information and information for one or more electronic devices 300 (e.g., service tier, device model, storage capacity, processing capabilities, communication capabilities, etc.);
- a correction database 216 storing frequency correction information as described in greater detail in reference to FIG. 4B; and
- a machine learning database 218 storing machine learning information as described in greater detail in reference to FIG. 4B.

In some implementations, the server system 206 includes a notification module (not shown) for generating alerts and/or notifications for users of the electronic device(s). For example, in some implementations the correction database is stored locally on the electronic device of the user, the server system 206 may generate notifications to alert the user to download the latest version(s) or update(s) to the correction database.

FIG. 4B is a block diagram illustrating sub-modules of the correction database 216 and machine learning database 218 of the server system 206 in FIG. 4A, in accordance with some implementations. In some implementations, the correction database 216 includes the following datasets or a subset or superset thereof:

- position data 4301 corresponding to different locations and/or orientations of associated audio devices (e.g., the positioning of microphones and/or speakers);
- vector data 4302 including phase shifts, phase differences, and/or feature vectors corresponding to different positions and/or orientations of associated audio devices;
- weight information 4303 including weights assigned to different signal-to-noise ratios, microphones, pairs of microphones, and/or positioning of microphones;
- training audio 4304 including training data (e.g., white noise, pink noise, etc.) for use with constructing the correction database 216; and
- correction data 4305 storing information used to correct audio frequency responses of audio devices, including, and not limited to:
- frequency responses 4306 including frequency responses and/or feature vectors corresponding to different locations and/or orientations of audio devices; and
- frequency corrections 4307 corresponding to respective frequency responses 4306.

As shown in FIG. 4B, the machine learning database 218 includes, in accordance with some implementations, the following datasets or a subset or superset thereof:

- neural network data 4401 including information corresponding to the operation of one or more neural network(s), including, and not limited to:
- positioning information 4402 including information (e.g., feature vectors) corresponding to different locations and/or orientations of audio devices; and
- correction data 4403 corresponding to the positioning information 4402.

Each of the above identified elements may be stored in one or more of the memory devices described herein, and corresponds to a set of instructions for performing the functions described above. The above identified modules or programs need not be implemented as separate software programs, procedures, modules or data structures, and thus various subsets of these modules may be combined or otherwise re-arranged in various implementations. In some implementations, the memory 410, optionally, stores a subset of the modules and data structures identified above. Furthermore, the memory 410 optionally stores additional modules and data structures not described above.

Figure 5A:
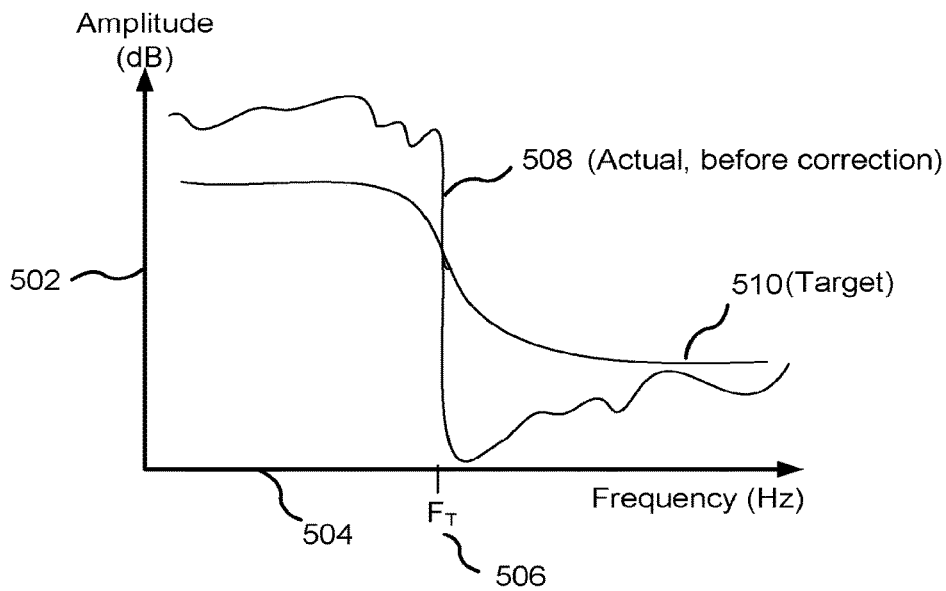
FIGS. 5A-5C illustrate example frequency responses, in accordance with some implementations.
Figure 5B:
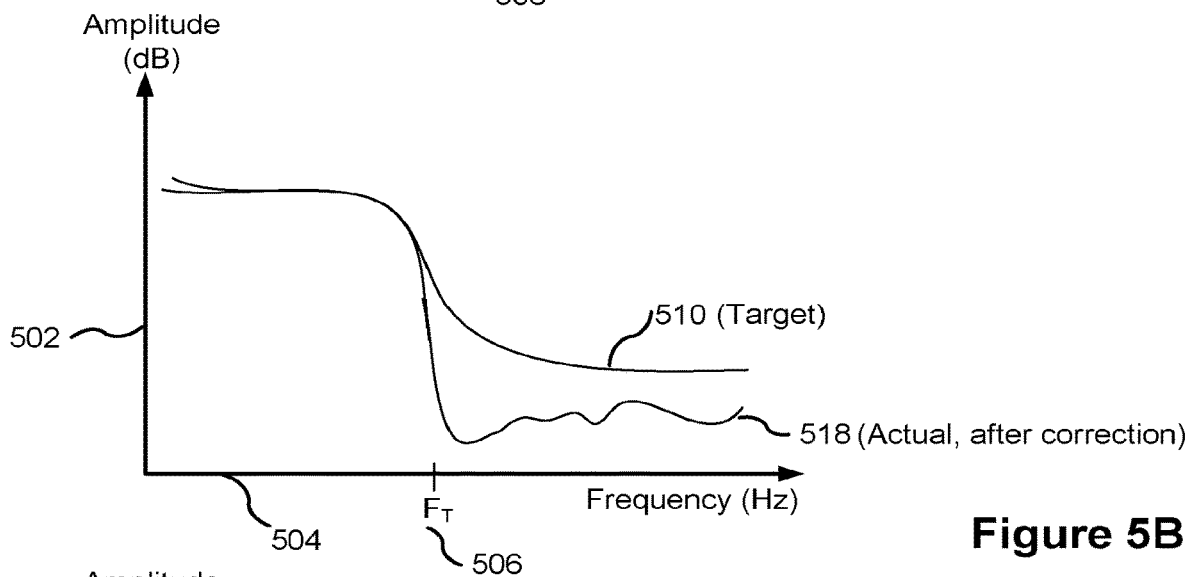
Figure 5C:
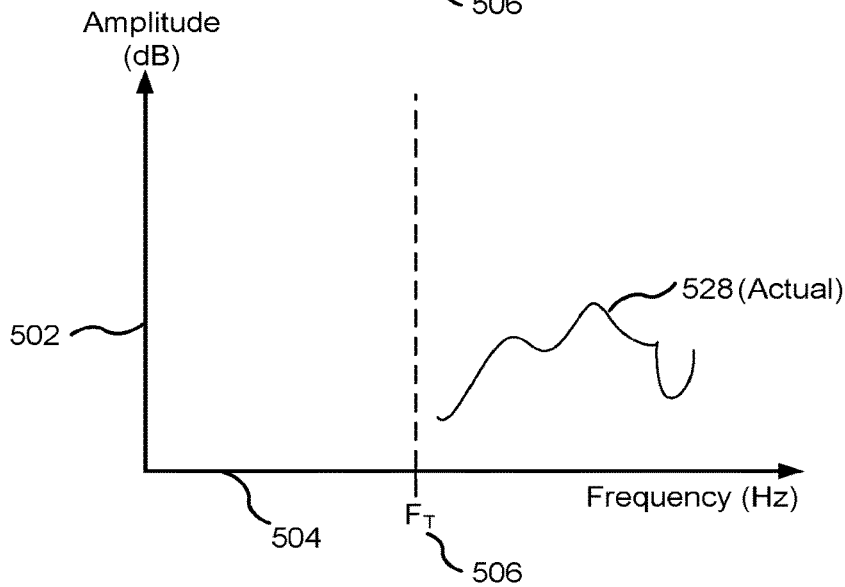

FIGS. 5A-5C illustrate example frequency responses of an audio device (e.g., electronic device 300), in accordance with some implementations. In FIG. 5A, a frequency response 508 is shown. The frequency response 508 measures the amplitude (e.g., gain and/or loudness) of the audio signal over a range of frequencies at which the audio is produced. The frequency response 508 is presented as a graph comprising amplitude (in units of decibel or dB) in the vertical axis 502 and frequency (in units of Hertz, or Hz) in the horizontal axis 504.

FIG. 5A also shows a transition (or threshold) frequency $F_T$ 506. In some implementations, the transition frequency $F_T$ 506 is based on the room in which the audio device is located. In some implementations, the transition frequency $F_T$ 506 is a predetermined threshold (e.g., 250 Hz). The transition frequency $F_T$ 506 is a frequency where the audio wavelength is comparable to the dimensions of the room and so in some instances the room resonances dominate. The transition frequency $F_T$ 506 is sometimes referred to as a resonant frequency or Schroeder frequency, below which the room acts as a resonator.

In some implementations, the frequency response 508 is a measured audio output response prior to equalization. In some implementations, the frequency response 508 is obtained using microphones on an electronic device (e.g., the microphones 106 in FIG. 1A or the microphones 122 in FIG. 1B). In some implementations, the frequency response 508 corresponds to a position of the audio device in a particular room or open space. As shown in FIG. 5A, in some instances, the frequency response 508 includes fluctuations in amplitude within a range of frequencies (e.g., between 0 Hz and $F_T$ 506). In some instances the fluctuations are a result of positioning of the audio device within a room (e.g., proximity to boundaries and/or objects in the room) and characteristics of the room (e.g., audio-reflectivity of boundaries and/or objects in the room).

FIG. 5A further shows a target frequency response 510. In some implementations, the target frequency response 510 is an ideal frequency response for a user of the audio device. In some implementations, the target frequency response 510 is a frequency response is an optimized frequency response across a band of frequencies. In some implementations, the target frequency response 510 represents a frequency response of the audio device in the absence of audio reflections, absorptions, and scatterings. Accordingly, in some instances, the target frequency response 510 does not exhibit fluctuations in amplitude over a range of frequencies (e.g., between 0 Hz and $F_T$).

As shown in FIG. 5A, in some instances, the target frequency response 510 exhibits lower amplitude than the actual frequency response 508 at frequencies below the transition frequency $F_T$ 506. In some instances, the target frequency response 510 exhibits higher amplitude than the frequency response 508 at frequencies above the transition frequency $F_T$ 506. In some implementations, the target frequency response 510 has uniform amplitude over a range of frequencies below the transition frequency $F_T$ 506. In some implementations, the target frequency response 510 has uniform amplitude over a range of frequencies above the transition frequency $F_T$ 506. In some implementations, the target frequency response 510 is obtained from a correction database (e.g., correction database 216). In some implementations, the target frequency response 510 is obtained through analysis of the environs of the audio device, e.g., using machine learning.

FIG. 5B shows a corrected frequency response 518 in accordance with some implementations. In some implementations, the corrected frequency response 518 is an audio output response after equalization correction. In some implementations, the frequency response 518 is the frequency response from an audio device after a correction toward the target frequency response 510 has been applied.

As shown in FIG. 5B, the corrected frequency response 518 exhibits fairly uniform amplitude (e.g., compared to the frequency response 508) over a range of frequencies below the transition frequency $F_T$ 506. In some implementations, (not shown) the frequency response 518 matches the target frequency response 510. In some implementations, the frequency response 518 matches the target frequency response 510 at frequencies below the transition frequency $F_T$ 506. In some implementations, the frequency response 518 has similar amplitude to that of the target frequency response 510 below the transition frequency $F_T$ 506. In some implementations, the frequency response 518 displays more amplitude variations above the transition frequency $F_T$ 506 compared to below the transition frequency $F_T$ 506 (e.g., a greater correction is applied to frequencies below the transition frequency $F_T$ 506).

FIG. 5C shows a frequency response 528 in accordance with some implementations. In some implementations, the frequency response 528 is a measured audio output response before equalization. In some implementations, the frequency response 528 is obtained using microphones of the electronic device 300, with the electronic device 300 located at a position in a room or in an open space. In some implementations, the frequency response 528 only includes amplitude contributions over a range of frequencies that is above the transition frequency $F_T$ 506. In some implementations, no equalization is applied to the frequency response 528 in accordance to a determination that the amplitude contributions of the frequency response 528 are only above the transition frequency $F_T$ 506.

FIGS. 6A-6D, 7A-E, and 8A-8F illustrate examples of positioning and operation of the electronic device 300 of FIG. 3A, in accordance with some implementations. For simplicity, in these examples, the electronic device 300 is represented by the electronic device 100 (FIG. 1A), however, in other implementations, the electronic device 300 includes an electronic device 120 (FIG. 1B), an electronic device 202 (FIG. 2), and/or other electronic device.

Figure 6A:
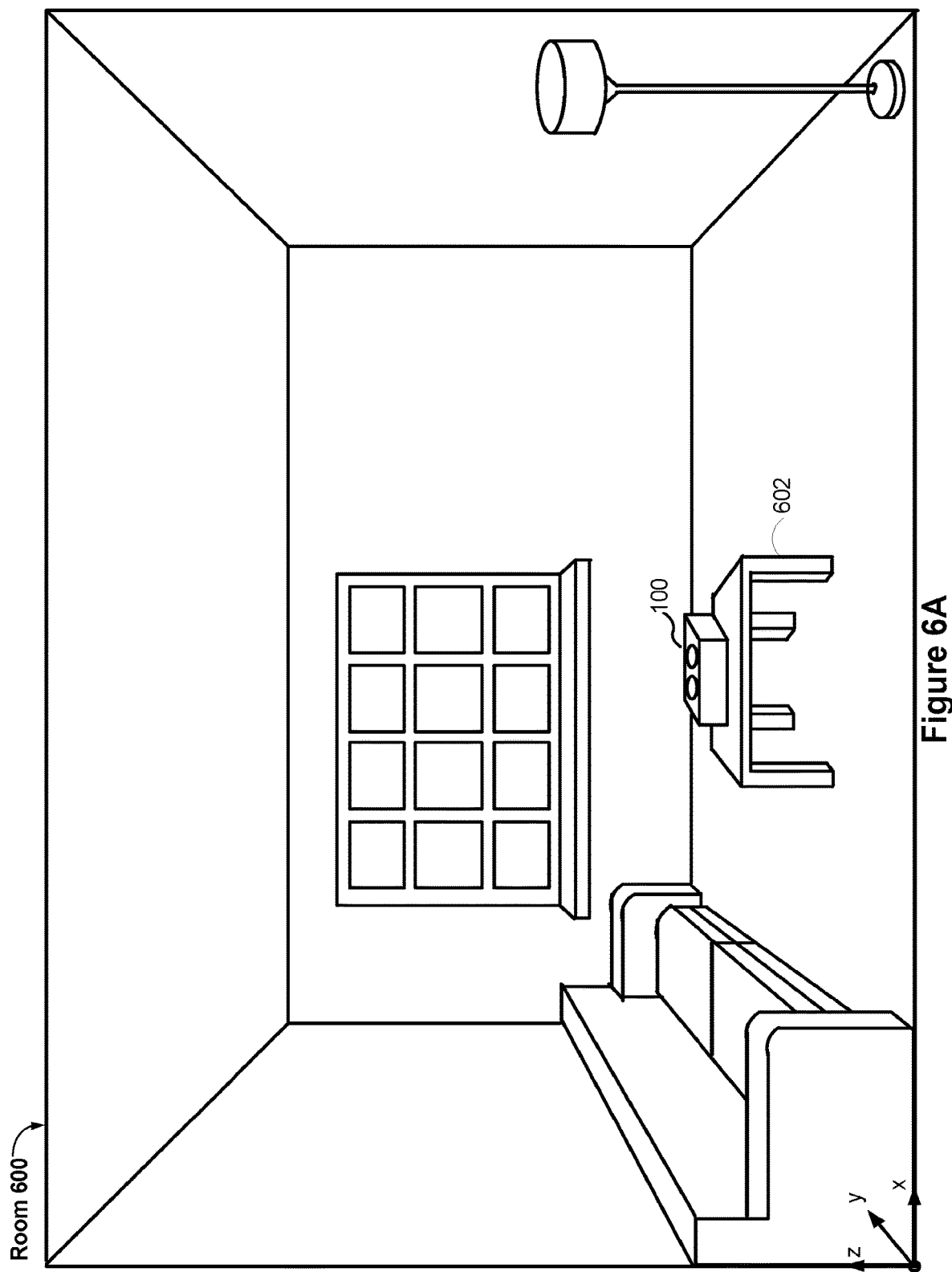
FIGS. 6A and 6B illustrate example positioning and operation of the electronic device of FIG. 3A, in accordance with some implementations.

FIG. 6A shows a room 600 that includes the electronic device 100 positioned on a table 602 with the speakers 102 of the electronic device 100 facing upward. As shown in FIG. 6A, the electronic device 100 is located near a center of the room 600 (e.g., not proximate to any of the walls or the ceiling) and thus reflection effects are less dominate as compared to the positioning illustrated in FIGS. 7 and 8. In some implementations, (not shown) the room 600 includes multiple numbers and types of electronic devices, which are placed in any location and/or orientation within the room 600. In some implementations, (not shown) the room 600 is a subset of an open space.

Figure 6B:
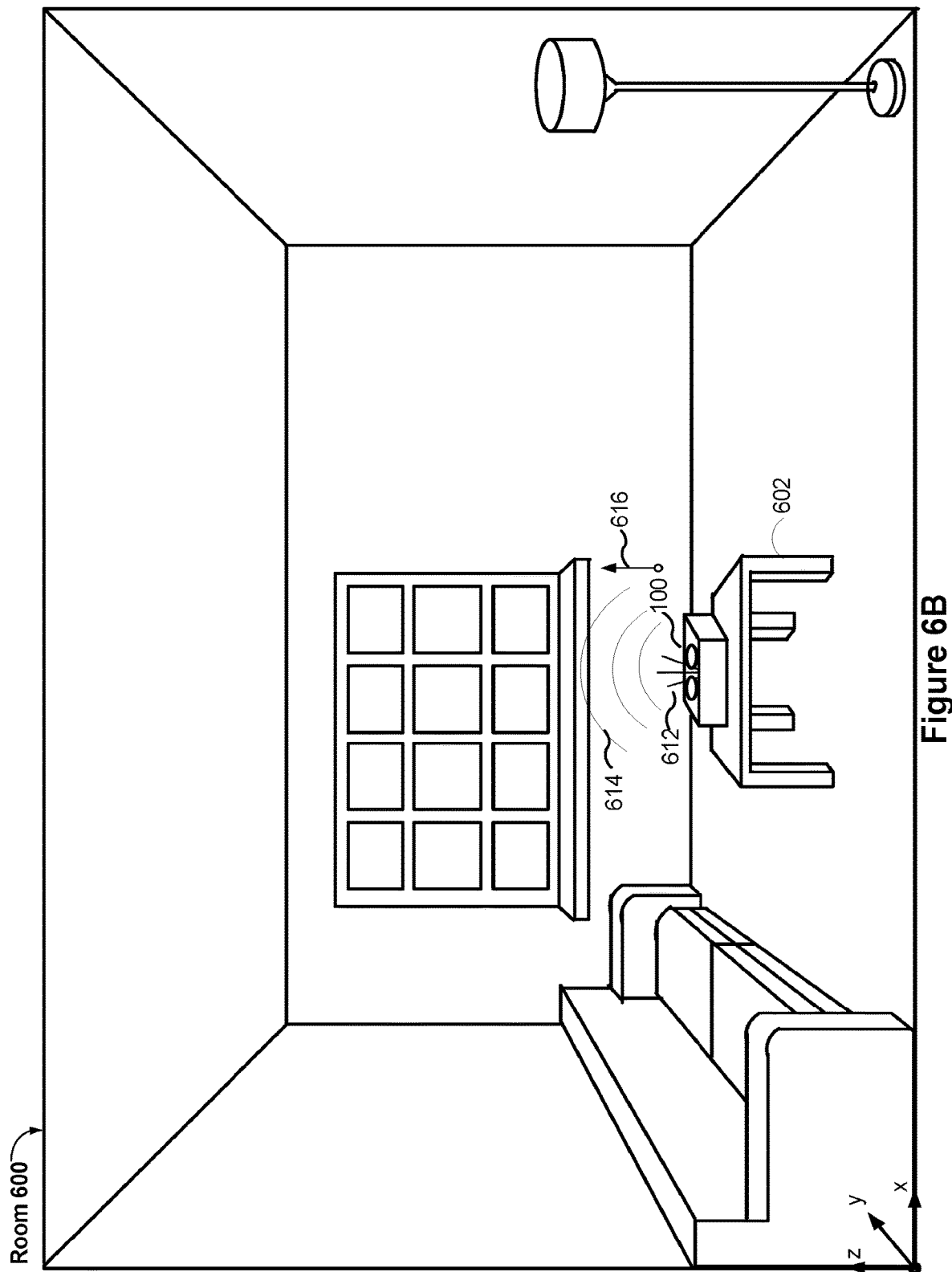

FIG. 6B shows the speakers 102 of the electronic device 100 producing audio 612, in accordance with some implementations. Audio waves travel from the speaker(s) of the electronic device 100, including waves 614 which are directed in the upward (+z) direction 616. In some implementations, sound reflects off the table 602. In some instances, because of the large distance between the electronic device 100 and the ceiling of the room 600, little or no sound is reflected from the ceiling (e.g., an imperceptible amount to someone listening in the room). In some instances, the waves 614 reach the ceiling of the room 600 and are reflected from the ceiling. For example, based on a volume of the audio, a person listening in the room may or may not notice audio contributions from waves reflected from the ceiling. In cases where the audio contributions are noticeable, audio equalization is desired to minimize resulting distortions in the audio.

Figure 6D:
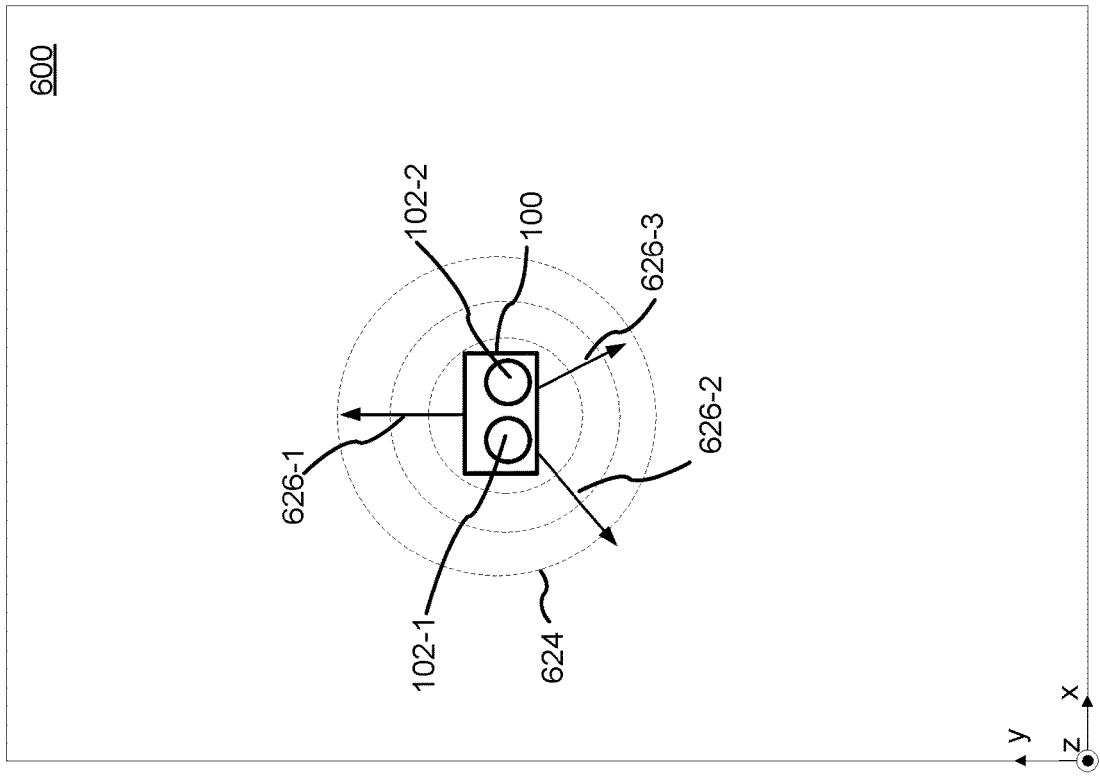
FIG. 6D is a plan view of the electronic device positioned in FIG. 6B showing audio output of the electronic device, in accordance with some implementation.
Figure 6C:
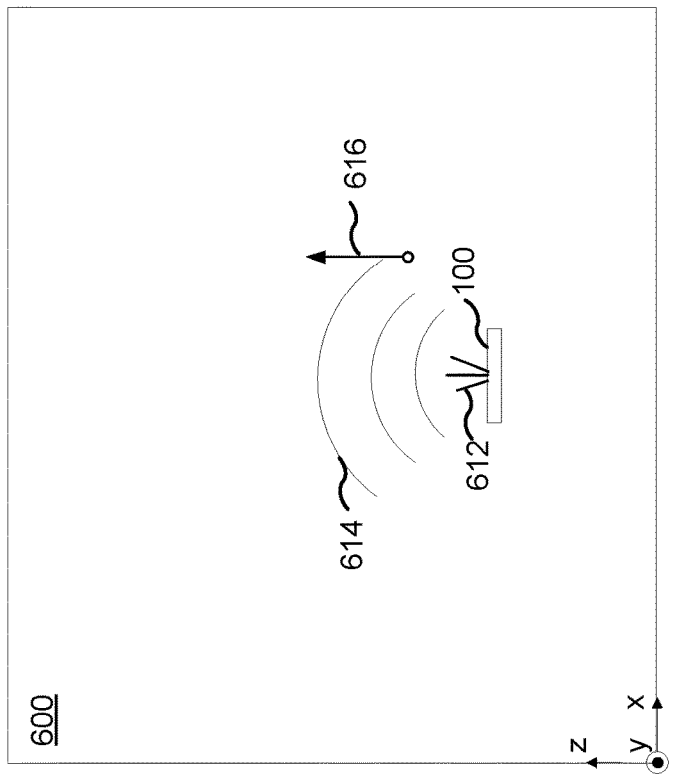
FIG. 6C is a side view of the electronic device positioned in FIG. 6B showing audio output of the electronic device, in accordance with some implementation.

FIGS. 6C and 6D show sound waves coming out of the electronic device 100 in multiple directions, in accordance with some implementations. FIG. 6C shows a side view of the room 600 of FIG. 6B and FIG. 6D shows the corresponding plan view of the room 600. In some implementations, when the electronic device 100 produces the audio output 612, audio waves are emitted from the electronic device 100, including the waves 614 which travel in the upward (+z) direction 616 as shown in FIG. 6C. In some implementations, when the electronic device 100 produces the audio output 612, audio waves 624 are emitted from the electronic device 100 in a concentric, outward direction 626 (in the x-y plane).

Figure 7A:
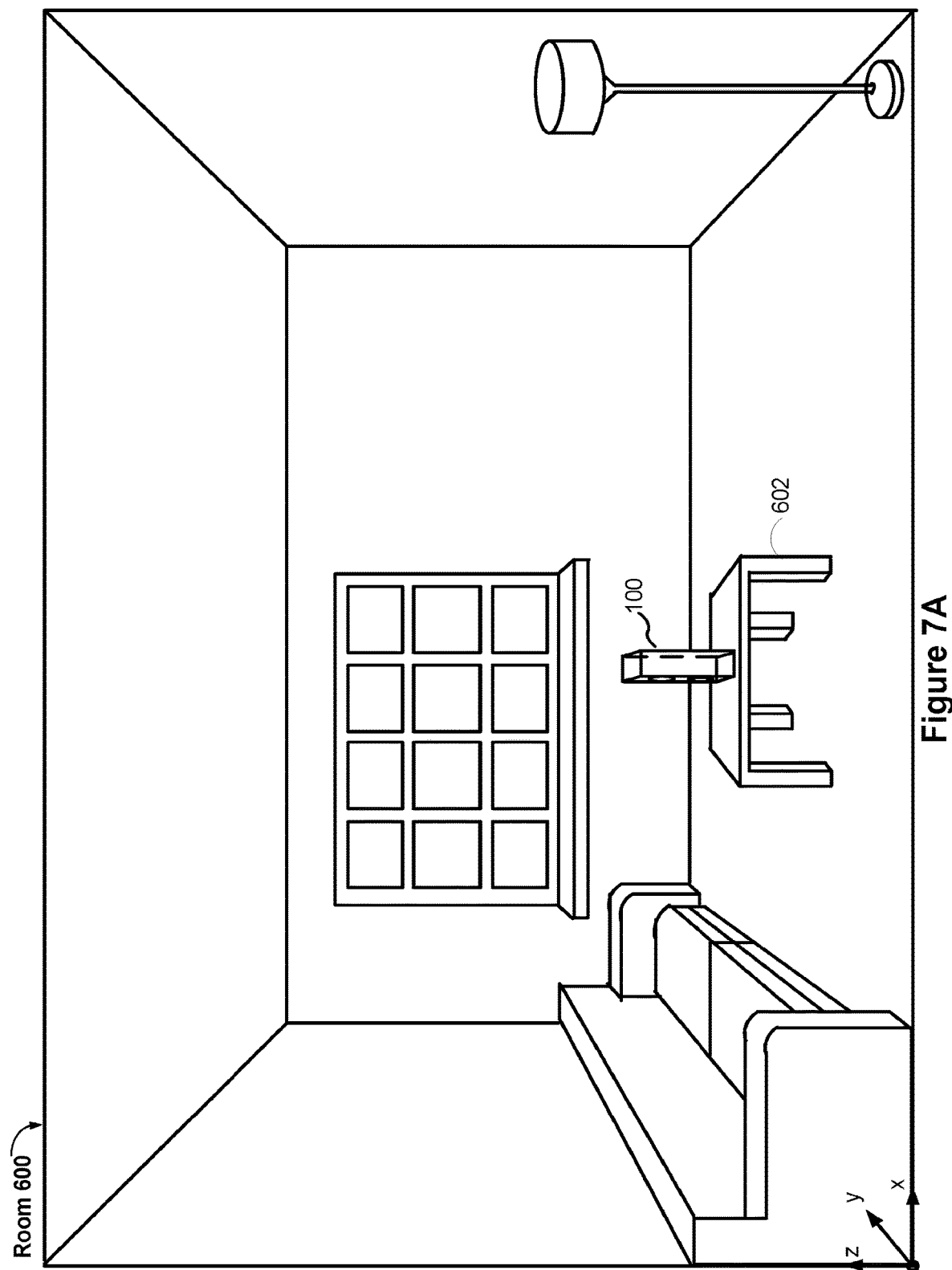
FIGS. 7A-7C illustrate example positioning and operation of the electronic device of FIG. 3A, in accordance with some implementations.
Figure 7B:
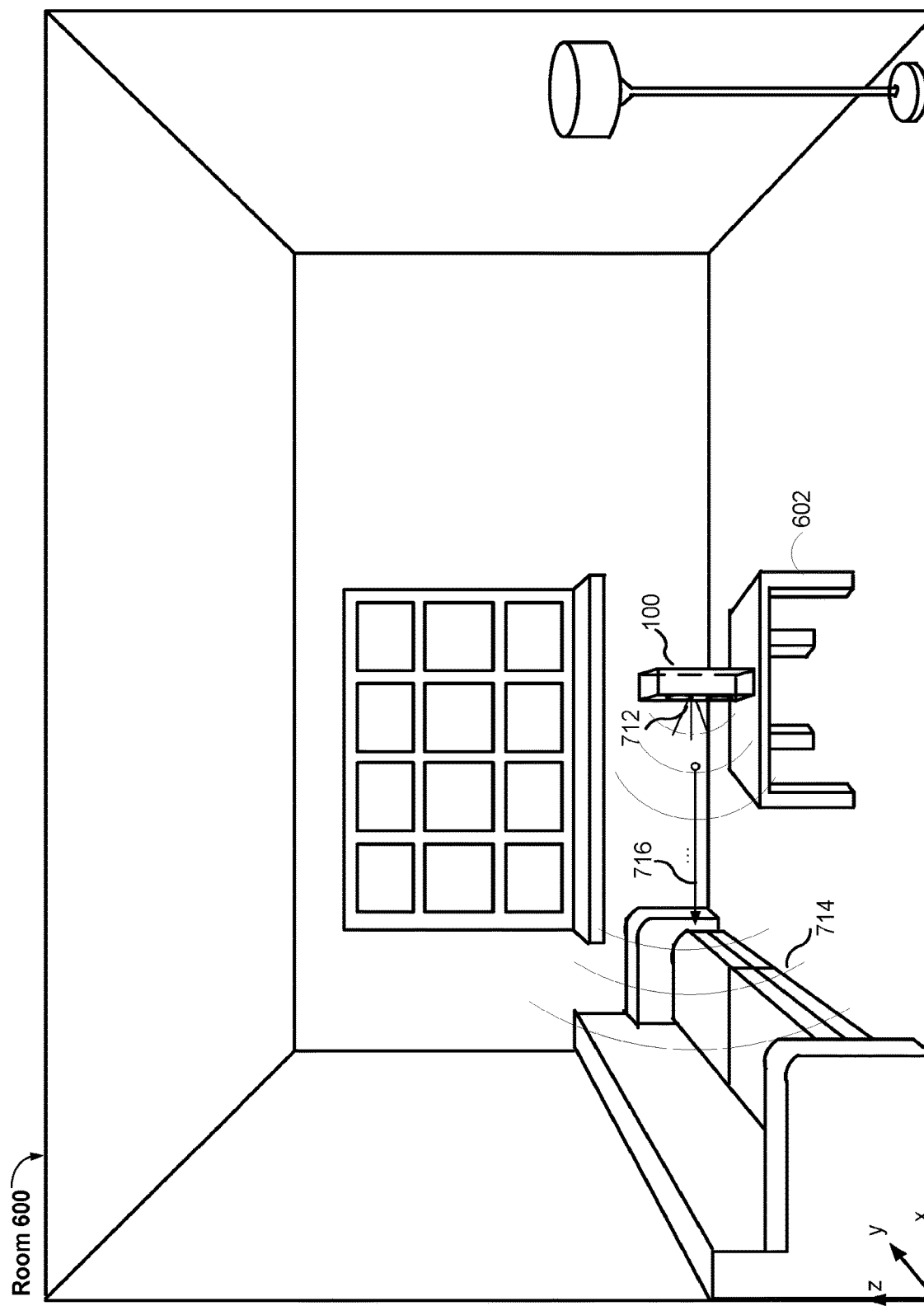
Figure 7C:
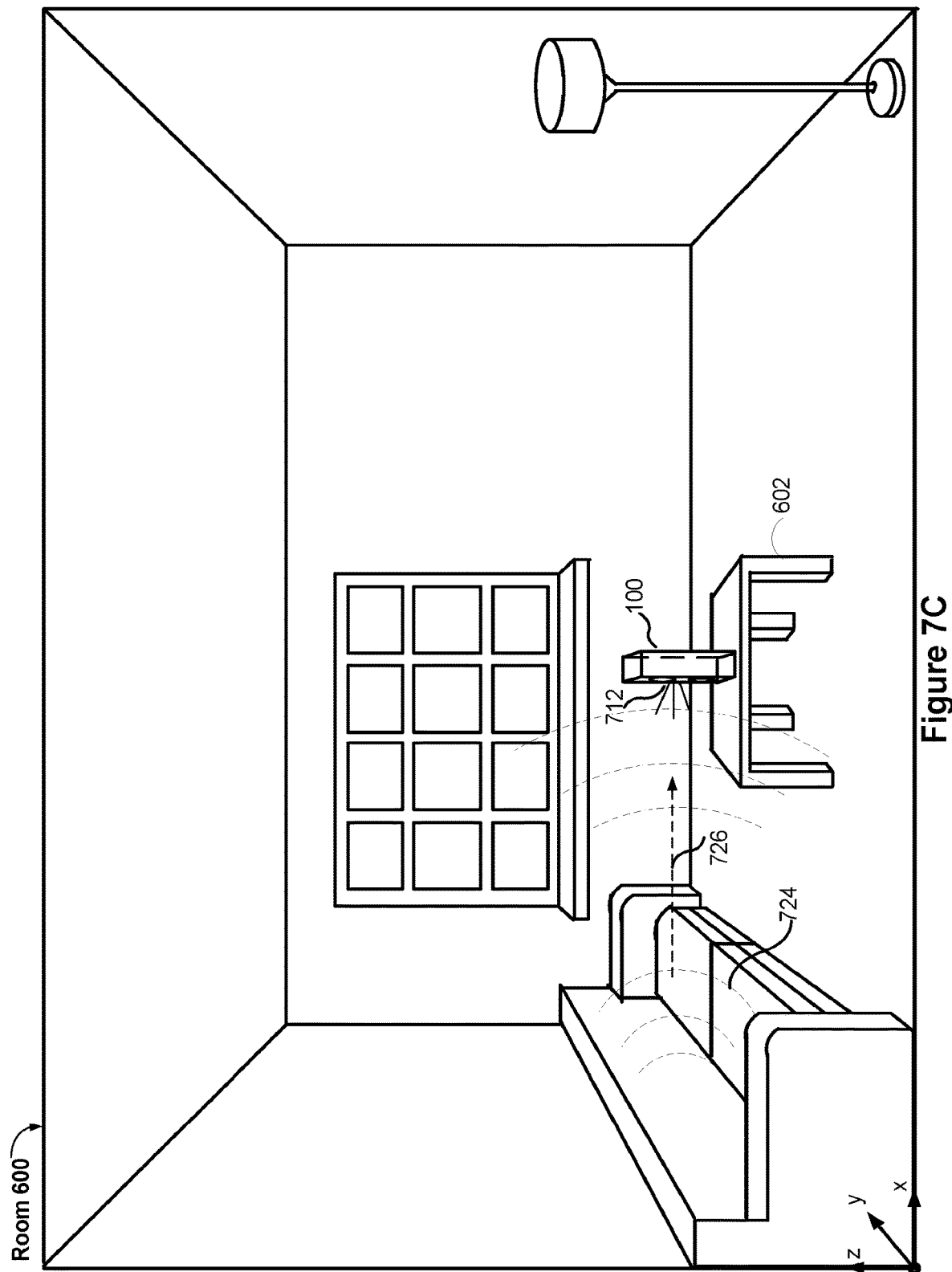

FIGS. 7A-7C illustrate example positioning and operation of the electronic device 300 of FIG. 3A, in accordance with some implementations. FIG. 7A shows the same room 600 with the electronic device 100 placed on the table 602. In FIG. 7A, the electronic device 100 is oriented in an upright direction, with the speakers 102 facing the sofa, and proximate to one surface (e.g., the sofa). In some implementations and instances, each proximate surface results in an approximately 3 dB boost at low frequencies (e.g., frequencies below the transition frequency of the room), which audio equalization seeks to correct. FIG. 7B shows the electronic device 100 outputting audio 712. Audio waves travel from the speakers 102 of the electronic device 100, including waves 714 which travel in the leftward (−x) direction 716. In some instances, the waves 714 hit the sofa and are reflected from the sofa. In some instances, the waves 714 hit the surface(s) of the walls and/or other objects in the room 600 and reflect off these walls and/or objects. In some instance, audio waves reflect off the table 602 and/or the ceiling of the room. The reflected audio waves produce distortions in the audio (e.g., resulting in the frequency response 508 shown in FIG. 5A).

FIG. 7C shows waves 724 reflected from the sofa as a result of the waves 714 hitting the sofa. The waves 724 travel in the rightward (+x) direction 726 (e.g., in the opposite direction of travel of the waves 714).

Figure 7D:
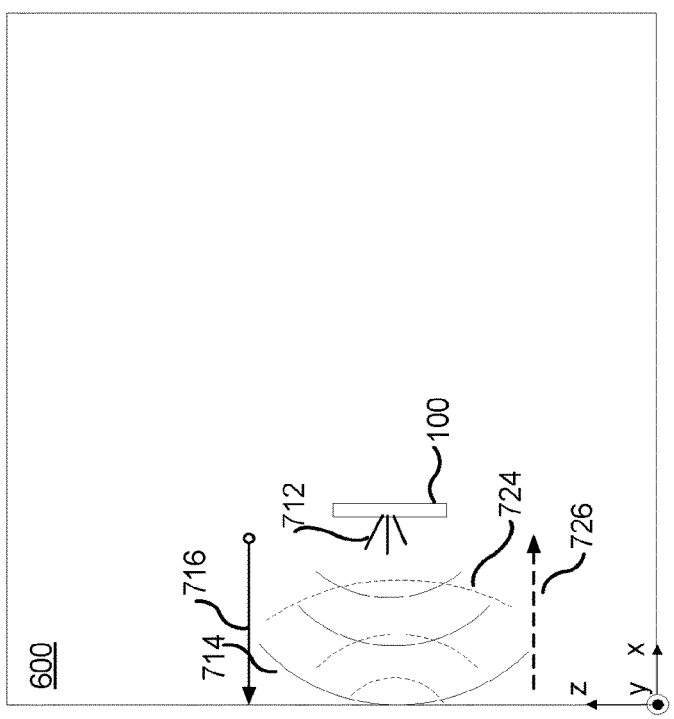
FIG. 7D is a side view of the electronic device positioned in FIG. 7B showing audio output of the electronic device, in accordance with some implementation.
Figure 7E:
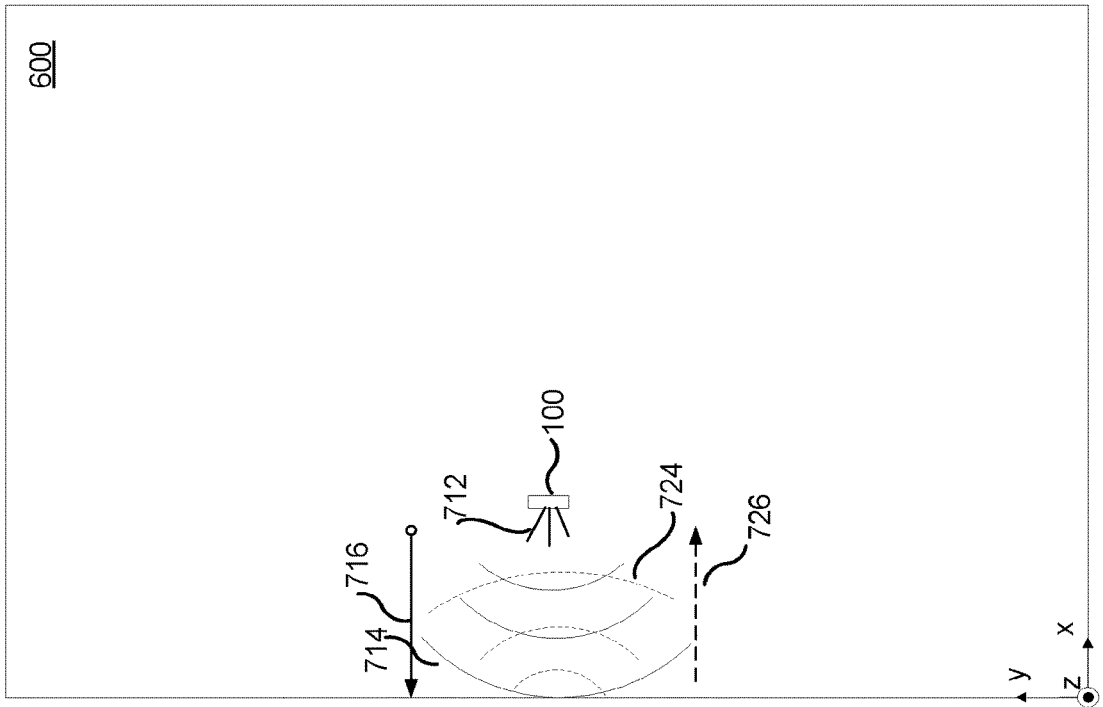
FIG. 7E is a plan view of the electronic device positioned in FIG. 7B showing audio output of the electronic device, in accordance with some implementation.

FIGS. 7D and 7E show, respectively, side and plan views of the room 600 with the audio 712 coming out of the electronic device 100, in accordance with some implementations. In the example shown in these Figures, waves are emitted from the electronic device 100, including the waves 714 which travel in the leftward (−x) direction 714. In this example, the waves 714 hit the left wall (or the y-z plane) of the room 600, resulting in the reflected waves 724 which travel in the rightward (+x) direction 726 (e.g., in the opposite direction of travel of the waves 714). In some instances, some of the reflected waves 724 travel back to the electronic device 100.

Figure 8A:
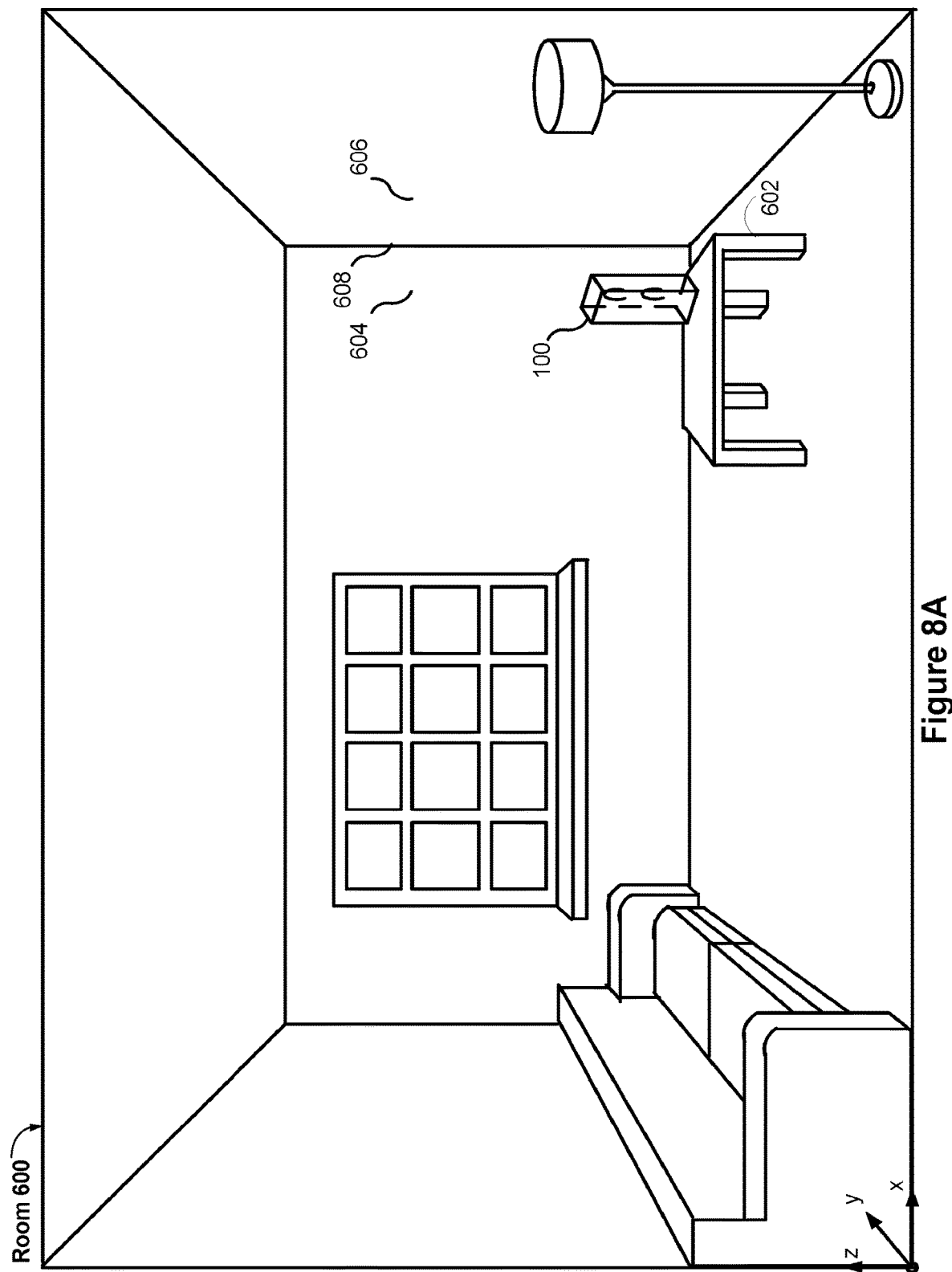
FIGS. 8A-8C illustrate example positioning and operation of the electronic device of FIG. 3A, in accordance with some implementations.
Figure 8B:
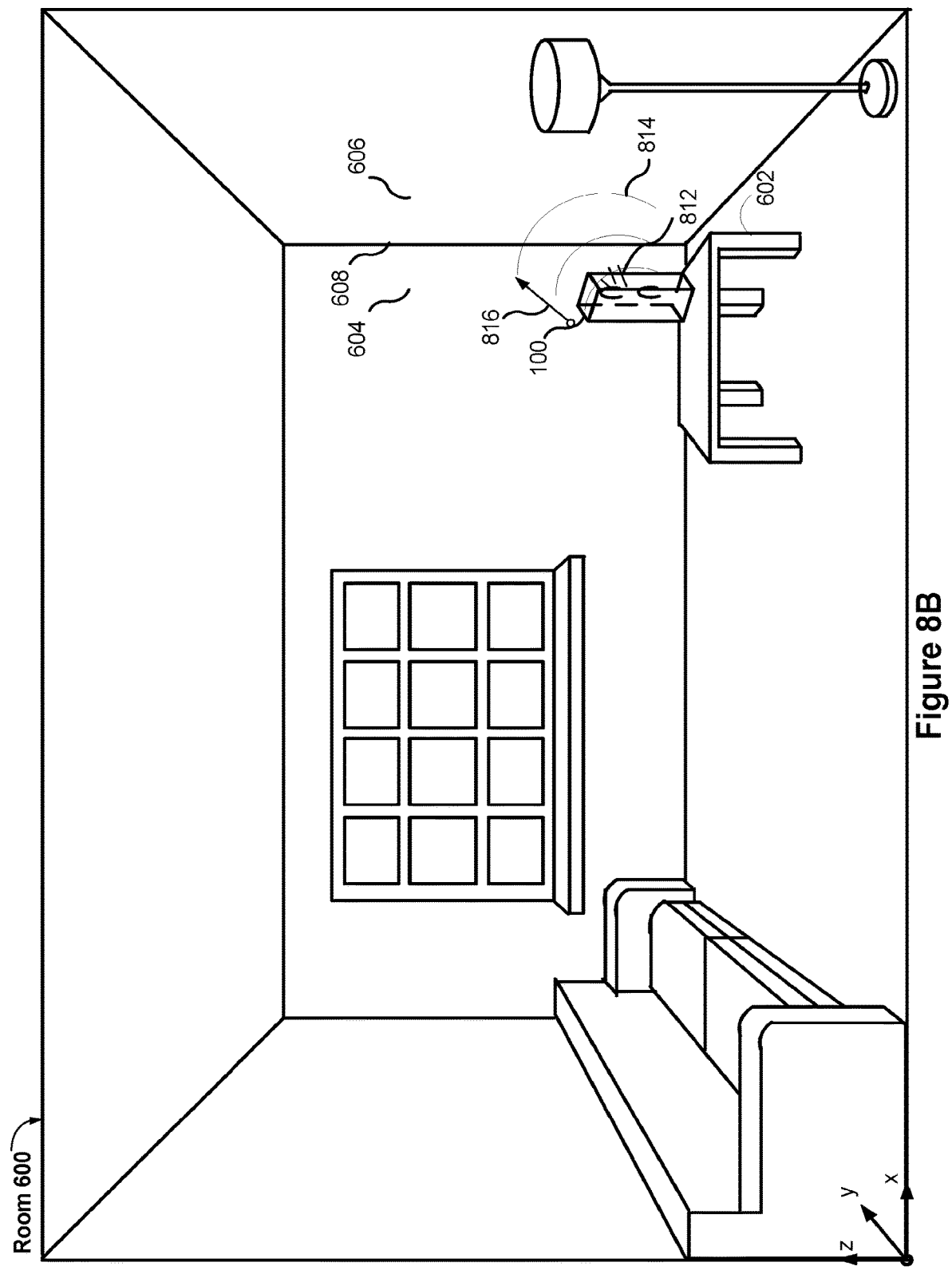
Figure 8C:
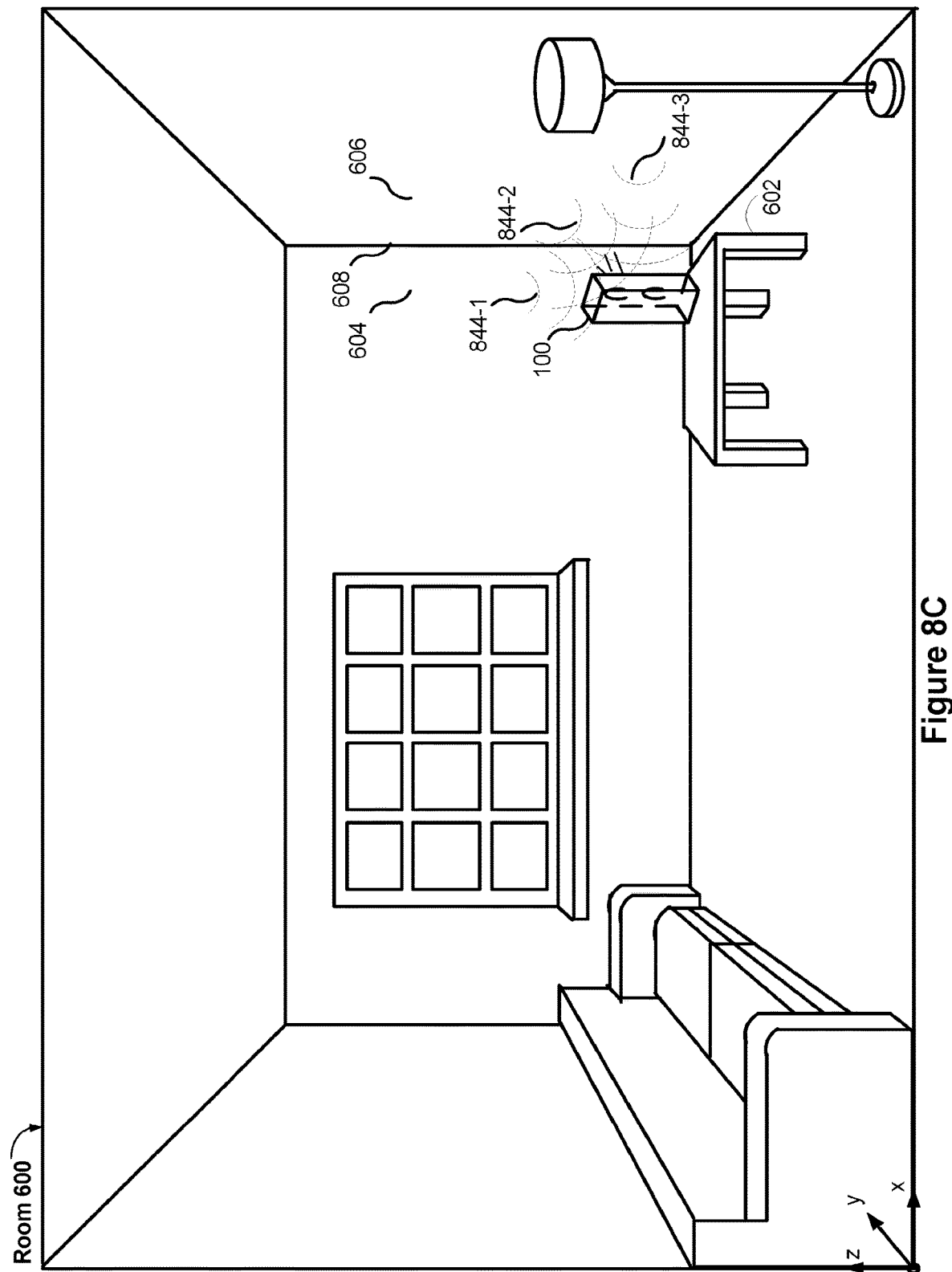

FIGS. 8A-8C illustrate example positioning and operation of the electronic device of FIG. 3A, in accordance with some implementations. FIG. 8A shows the room 600 with the electronic device 100 placed on the table 602. In FIGS. 8A-8C, the table 602 is positioned to be close to a back edge 608 of the room 600 where the back wall 604 and the right wall 606 meet. The electronic device 100 is oriented in the upright direction, with its speakers directed toward the edge 608. Thus, as illustrated in FIG. 8C, the sound produced by the speaker interacts with at least two surfaces. In some implementations and instances, the two proximate surfaces result in an approximately 6 dB boost at low frequencies, which audio equalization seeks to correct.

FIG. 8B shows the electronic device 100 producing audio 812. The audio output 812 includes waves 814 which radiate concentrically in an outward direction 816 toward the edge 608 between back wall 604 and the right wall 606. In some instances, the waves 814 reflect off one or more of: the back wall 604, the right wall 606, and/or the edge 608.

FIG. 8C shows reflected waves 844, including waves 844-1 that are reflected from the back wall 604, waves 844-3 that are reflected from the right wall 606, and waves 844-2 that are reflected from the edge wall 608. In some instances, audio also reflects off the table 602 on which the electronic device 100 is placed. In some instances, the waves 814 hit one or more surface(s) and object(s) in the room 600 and are reflected off the surface(s) and/or object(s).

FIGS. 8D-8F are plan views of the room 600 illustrating an example operating sequence of the electronic device 100 positioned as in FIG. 8B, in accordance with some implementations. FIG. 8D shows the position of the electronic device 100 in the room 600. FIG. 8E shows the electronic device 100 outputting audio 812. In some implementations, the outputted audio 812 includes the waves 814 traveling in the direction 816 toward the edge 608 between the back wall 604 and the right wall 606. In some instances, the waves 814 hit the back wall 604, the right wall 606, and the edge 608.

FIG. 8F shows waves 844 reflecting from the back wall 604, the right wall 606, and the edge 608. The reflected waves 844-1 are from the back wall 604 and travel in a direction 846-1. The reflected waves 844-3 are from the right wall 606 and travel in a direction 846-3, and the reflected waves 844-2 are from the edge 608 and travel in a direction 846-2.

In some implementations and instances (not shown), the electronic device 300 is proximate to three surfaces, resulting in an approximately 9 dB boost at low frequencies. Thus, as illustrated by the examples in FIGS. 6-8, each different configuration affects the room transfer function (which affects the listening experience of users) and accordingly, there is a need to automatically determine the transfer functions and correct for them.

Figures 9G, 9H:
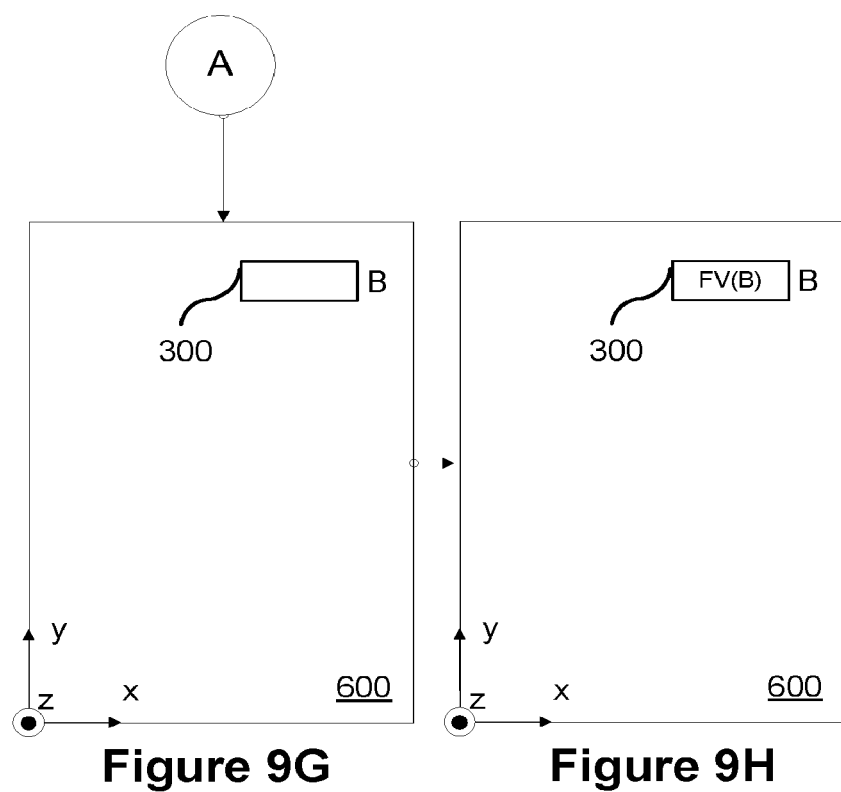

FIGS. 9A-9I illustrate example responses of the electronic device 300 presented in FIG. 3A, at various locations in the room 600, in accordance with some implementations. FIG. 9A shows the electronic device 300 at a position A in the room 600. FIG. 9B shows that a frequency correction FV(A) is applied to the electronic device 300.

In some implementations, the frequency correction FV(A) is determined based a frequency response for the electronic device 300 at position A. In some implementations, the frequency response corresponds to audio produced by the device 300 while at position A. In some implementations, the audio output is in response to a user prompt (e.g., the user interacts with electronic device 300 via a user interface or pushes a button which enables audio to be played, or through a voice-activated command). In some implementations, the electronic device 300 is configured to output audio automatically (e.g., at a certain time of the day). In some implementations, the frequency correction FV(A) is obtained from a correction database which is available locally on the electronic device 300 (e.g., correction database 352 in FIG. 3A) and/or from a server system 206 (e.g., correction database 216 in FIGS. 2 and 4A).

FIGS. 9C-9H illustrate responses to the electronic device 300 being moved from the position A to a position B in the room 600. FIG. 9C shows the electronic device 300 being moved from the position A to the position B. FIG. 9D shows a first response of the electronic device 300 as a result of the change from the position A to the position B, in accordance with some implementations. In the example of FIG. 9D, the electronic device 300 recognizes that it has been moved to the position B and accordingly, applies a frequency correction FV(B) that corresponds to the position B. In some implementations, the frequency correction FV(B) is from a correction database which is available locally on the electronic device (e.g., correction database 352) and/or from a server system (e.g., correction database 216). In some implementations, the electronic device 300 determines that it has moved to position B (e.g., via one or more sensors 330) and applies a stored correction corresponding to position B. For example, the electronic device 300 has previously been placed in position B and has stored the corresponding correction.

FIGS. 9E and 9F show a second response of electronic device 300 as a result of the change from the position A to the position B, in accordance with some implementations. In the example of FIGS. 9E-9F, the electronic device 300 initially retains the frequency correction FV(A) after it is moved to the position B. The electronic device 300 then proceeds to obtain and apply a frequency correction FV(B) corresponding to position B. In some implementations, the electronic device 300 continuously or intermittently determines a frequency response and updates the frequency correction accordingly. For example, the electronic device 300 determines a frequency response every two minutes and retrieves a corresponding frequency correction from the correction database 352. As another example, the electronic device 300 determines a frequency response every two minutes, compares the frequency response to the prior frequency response, and if different, obtains a new frequency correction. In some implementations, the electronic device 300 obtains a frequency correction in accordance with pre-determined conditions (e.g., the electronic device constantly monitors its location and proceeds to apply a frequency correction after determining that it has remained at a constant location after a certain time period).

FIGS. 9G and 9H show a third response of the electronic device 300 as a result of the change from position A to the position B, in accordance some implementations. In the example of FIGS. 9G-9H, the electronic device 300 recognizes that it has been moved from the position A and ceases to apply the frequency correction FV(A) that corresponds to equalization for position A. In this example, the electronic device 300 outputs audio at the position B without a correction applied until it obtains and applies the frequency correction FV(B).

In some implementations, the application of frequency correction(s) during/after movement is based on user device settings (e.g., the device settings 3502). For example, John likes to play music from his audio device while relaxing in the living room or cooking in the kitchen. Accordingly, he often places the device in two specific locations: on the coffee table in the living room, and on the countertop in the kitchen. For convenience, these locations ("living room" and "kitchen") are saved as preferred settings along with their corresponding frequency corrections.

Thus, when John is in the living room, the device obtains and applies the correction for the coffee table position, for example, in response to John notifying the device of its location (e.g., via an input device 312) on the coffee table, or in response to the device determining its location on the coffee table (e.g., via GPS).

At some later time, it is time for John to cook. As usual, he takes the audio device with him into the kitchen and sets it on the countertop. The device obtains and applies the correction for the countertop position, for example, in response to John notifying the device of its location (e.g., via an input device 312), in response to the device determining its location (e.g., via GPS), in response to other events (e.g., start of audio playback, device powering up), or on a continuous basis. Thus, the device is able to quickly apply the frequency corrections at preferred locations, giving John the best listening experience.

Figure 10:
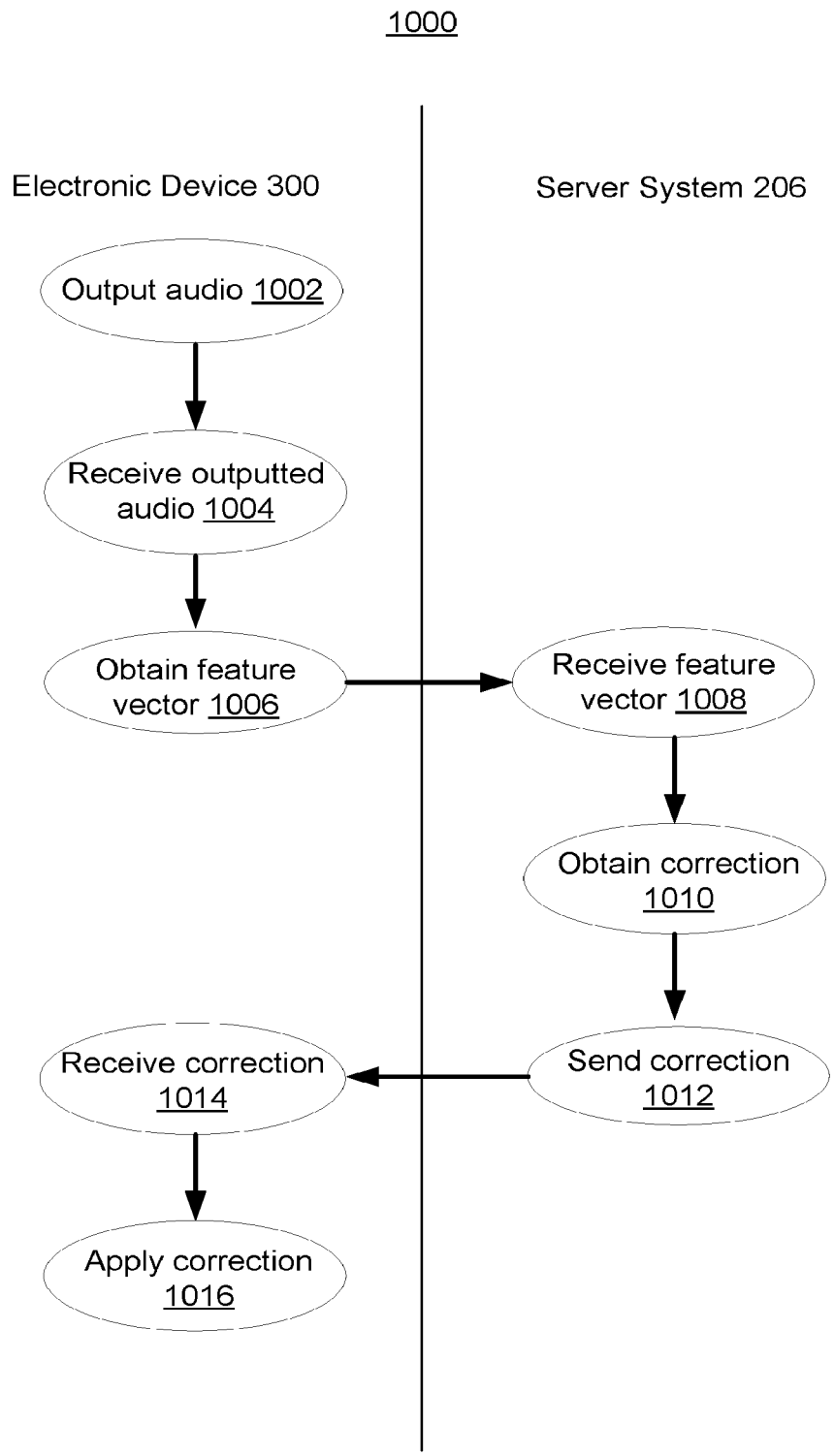
FIG. 10 is a flowchart representation of a method for automatic audio output equalization utilizing a single electronic device, in accordance with some implementations.

FIG. 10 is a flowchart representation of a method 1000 for automatic audio output equalization utilizing a single electronic device 300, in accordance with some implementations.

In some implementations, operations of the method 1000 are performed by: (1) one or more electronic devices 300; (2) one or more server systems, such as server system 206; or (3) a combination thereof. In some implementations, the method 1000 is governed by instructions that are stored in a non-transitory computer readable storage medium and that are executed by one or more processors of a device/computing system, such as the one or more processors 302 of the electronic device 300 and/or the one or more processors 402 of the server system 206. For convenience, specific operations detailed below are described as being performed by a particular device or server.

The electronic device 300 outputs (1002) audio. In some implementations, the electronic device 300 outputs the audio via one or more speakers (e.g., the speakers 102 and/or the speakers 104 in FIG. 1A). In some implementations, the outputted audio comprises audio content (e.g., music) that is selected by a user. In some implementations, the outputted audio comprises a test signal, and/or training audio. In some implementations, the test signal and/or training audio includes beeps, sweeps, pink noise, and/or a combination of music from a plurality of music genres.

In some implementations, the electronic device 300 receives (1004) its outputted audio. In some implementations, the outputted audio is received via one or more microphones (e.g., the microphones 122 in FIG. 1B) on the electronic device 300. In some implementations, the outputted audio content is received for a predetermined time period (e.g., 0.5 seconds, 1 second, 2 seconds, etc.). In some implementations, the outputted audio is received via one or more microphones distinct from the electronic device 300 (e.g., in addition to, or alternatively to, the microphones of the electronic device).

In some implementations, in accordance with the receipt of the outputted audio, the electronic device 300 obtains (1006) a feature vector. In some implementations, obtaining the feature vector includes determining phase(s), phase difference(s), and/or frequencies of the received audio of the electronic device 300 (e.g., via the audio analysis sub-module 3461 in FIG. 3A). In some implementations, the feature vector is generated based on phase differences in the outputted audio as received at different microphones of the electronic device 300. In some implementations, obtaining the feature vector includes determining the frequency response of the electronic device 300 (e.g., via the transfer function sub-module 3463 in FIG. 3A). In some implementations, obtaining the feature vector includes analyzing signal-to-noise ratios of received audio and/or assigning different weights to respective phase differences (e.g., via the weighting sub-module 3464 in FIG. 3A). In some implementations, the electronic device 300 sends the received audio data to the server system 206 and the server system 206 generates the feature vector.

In some implementations, after obtaining the feature vector, the electronic device 300 transmits (e.g., via the radios 320 and/or the radio communication module 336) the obtained feature vector to the server system 206 and the server system 206 receives (1008) the feature vector from the electronic device 300 (e.g., via the network interface 404 and/or the front end 212). In some implementation, the server system 206 also receives information including frequency response(s), phase difference(s) and/or location information about the electronic device 300.

In some implementations, the server system 206 obtains (1010) a correction (e.g., via equalization module 214) based on the received feature vector. In some implementations, the server system 206 generates the correction using a correction database that is located on the server system 206 (e.g., correction database 216 in FIG. 2). In some implementations, generating the correction comprises using machine learning method(s) to find the best match for the feature vector(s) (e.g., via machine learning database 218 in FIG. 2).

In some implementations, the electronic device 300 obtains a correction (e.g., via equalization module 346) based on the received feature vector. In some implementations, the electronic device 300 generates the correction using a correction database that is stored on the electronic device 300 (e.g., correction database 352 in FIGS. 3A and 3B) thus omitting the operations shown as performed at the server system 206 in FIG. 10. In some implementations, generating the correction comprises using machine learning method(s) to find the best match for the feature vector(s) (e.g., via machine learning database 354 in FIG. 3A).

In some implementations, after the server system 206 generates the correction for the electronic device 300, the server system 206 sends (1012) the generated correction to the electronic device (e.g., via the front end server 212 in FIG. 2). The electronic device 300 receives (1014) the correction from the server system 206 (e.g., via the radio communication module 336).

The electronic device 300 applies (1016) the correction to audio output by the electronic device 300, thus achieving audio equalization (e.g., via correction sub-module 3462 in FIG. 3A). In some implementations, the correction is applied automatically and without user input. In some implementations, the user receives a prompt (e.g., a short messaging service (SMS) message or email displayed on the UI of the electronic device) and proceeds to authorize the device to apply the correction.

In some instances and implementations, after the server system 206 receives the feature vector from the electronic device 300, the server system 206 foregoes generating and sending a correction to the electronic device 300 in accordance with a determination that the outputted audio does not meet one or more predetermined conditions (e.g., signal-to-noise ratio, audio frequencies exceeding a transition frequency, etc.). Accordingly, no equalization is applied to the electronic device 300.

In some implementations, the electronic device 300 continuously or intermittently obtains a feature vector for its outputted audio and sends the feature vectors to the server system 206. In some implementations, after applying the correction, the electronic device 300 forgoes obtaining a feature vector until the device determines that its positioning has changed.

Figure 11:
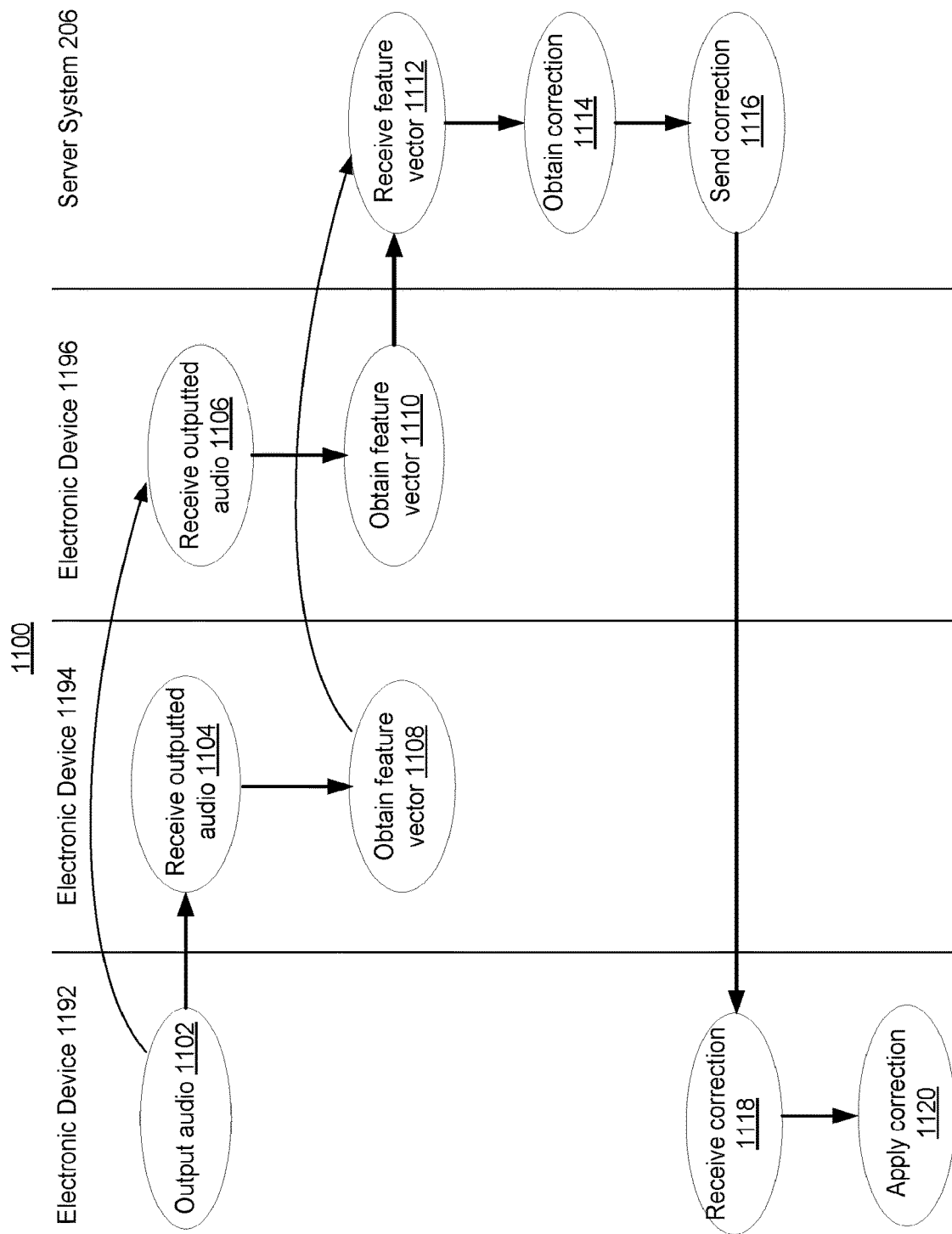
FIG. 11 is a flowchart representation of a method for automatic audio output equalization utilizing a plurality of electronic devices, in accordance with some implementations.

FIG. 11 is a flowchart representation of a method 1100 for automatic audio output equalization utilizing a plurality of electronic devices. In the example of FIG. 11, the plurality of electronic devices includes an electronic device 1192 (e.g., a device 120, FIG. 1B), an electronic device 1194 (e.g., a device 100, FIG. 1A), and an electronic device 1196 (e.g., a device 202, FIG. 2), in accordance with some implementations. In some implementations, the electronic devices are located at different positions within a room. In some implementations, the plurality of electronic devices more or less than the three devices shown in the example of FIG. 11.

In some implementations, the electronic device 1192 outputs (1102) audio. In some implementations, the electronic device 1192 outputs the audio via one or more speakers (e.g., the speakers 126 in FIG. 1B). In some implementations, the outputted audio comprises content (e.g., music) that is selected by a user. In some implementations, the outputted audio comprises a test signal, and/or training audio. In some implementations, the test signal and/or training audio includes beeps, sweeps, pink noise, and/or a combination of music from a plurality of music genres.

In some implementations, the outputted audio from the electronic device 1192 is received by the other electronic devices, including the electronic device 1194 which receives (1104) the outputted audio, and the electronic device 1196 which receives (1106) the outputted audio. In some implementations, the outputted audio is received by respective microphones in or on the electronic device 1194 (e.g., the microphones 106) and the electronic device 1196 (e.g., microphones 314 in FIG. 3A). In some implementations, the electronic device 1194 and the electronic device 1196 are located at different positions of a room, and their respective microphones are used to capture the acoustic response for the audio output by electronic device 1192. In some implementations, the electronic device 1194 and the electronic device 1196 receive outputted audio content for a respective predetermined time period (e.g., 0.5 seconds, 1 second, 2 seconds, etc.).

In some implementations, the electronic device 1194 and the electronic device 1196 each obtain (1108, 1110) a feature vector corresponding to the received audio. In some implementations, obtaining the respective feature vector at each of the electronic devices includes determining (e.g., using the audio analysis sub-module 3461 in FIG. 3A) respective phase(s), phase differences, and/or frequencies of the audio received via the microphone(s) at each of the electronic devices. In some implementations, a single feature vector is generated based on a collection of audio received at the various microphones of the electronic devices 1194, 1196. For example, each electronic device 1194, 1196 sends audio data to a single destination device (e.g., server system 206) and the destination device generates a corresponding feature vector. In some implementations, the destination device obtains relative positioning information for the electronic devices 1194, 1196 and generates the feature vector based on the audio data and the relative positioning information.

In some implementations, the electronic device 1194 and the electronic device 1196 each transmit the respective obtained feature vectors to the server system 206. The server system 206 receives (1112) the respective generated feature vectors from the electronic device 1194 and the electronic device 1196 (e.g., via front end 212). In some implementation, the server system 206 also receives audio information including respective frequency response(s), phase difference (s), and/or positioning information for the electronic devices 1194, 1196.

The server system 206 obtains (1114) a correction for the electronic device 1192 using the obtained feature vectors. In some implementations, the server system 206 generates the correction using a correction database that is located on the server system 206 (e.g., correction database 216 in FIG. 2). In some implementations, generating the correction comprises using machine learning method(s) to find the best match for the feature vector(s) (e.g., via machine learning database 218 in FIG. 2). In some implementations, the server system 206 queries a correction database (e.g., correction database 216) and receives a correction corresponding to the obtained feature vectors. In some implementations, the server system 206 assigns different weights to the respective feature vectors or components of the feature vectors. In some implementations, the server system 206 foregoes generating a correction based on a determination that the feature vectors meet one or more predetermined conditions (e.g., include only frequencies above a transition frequency and/or have a signal-to-noise ratio that exceeds a particular threshold).

In some implementations, the electronic device 1192 receives the feature vectors from the electronic devices 1194, 1196. In some implementations, the electronic device 1192 obtains the correction based on the obtained feature vectors (e.g., using the correction database 352 and/or the machine learning database 354).

In some implementations, after obtaining the correction, the server system 206 sends (1116) the correction to the electronic device 1192. The electronic device 1192 receives (1118) the correction sent by the server system 206. The electronic device 1192 then applies (1120) the correction to achieve audio equalization. In some implementations, the correction is applied automatically and without user input (e.g., via the equalization module 346 in FIG. 3A).

In light of these principles, we now turn to certain implementations.

Machine Learning Techniques

In some instances, machine learning is employed to automatically equalize audio output of an audio device (e.g., audio output of the electronic device 300). Utilizing machine learning techniques enables the system to incorporate audio data from multiple distinct microphone devices. For example, as discussed previously with respect to FIG. 11, a first client device outputs user audio content and the audio content is then received at other client devices in proximity to the first client device. In this example, a transfer function is generated based on the received audio content and the transfer function is input into a neural network to obtain a frequency correction. In some instances, the use of the neural network in this example enables the system to obtain a more precise frequency correction than is obtained from other implementations (e.g., from a pre-built correction database).

Figure 12:
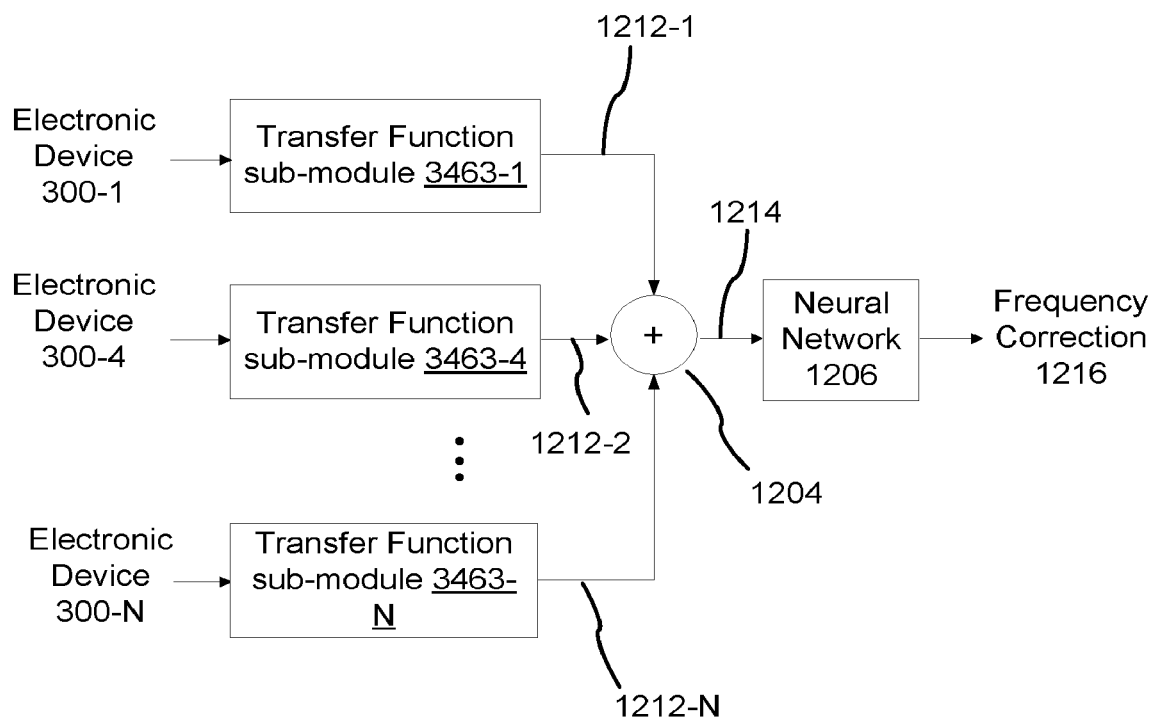
FIG. 12 is a block diagram illustrating a frequency correction process with machine learning utilizing a neural network, in accordance with some implementations.

FIG. 12 is a block diagram illustrating a frequency correction process with machine learning utilizing a neural network 1206, in accordance with some implementations. In some implementations, one of the electronic devices (e.g., 300-1) outputs audio and the outputted audio is received by each of the electronic devices 300 (e.g., using respective microphone(s) 314). In some implementations, (not shown) the electronic device that outputs the audio does not itself receive/analyze the audio. In some implementations, as shown, each of the electronic devices 300 determines its respective audio transfer function 1212 based on the received audio output using its respective transfer function sub-module 3463. In some implementations, (not shown) each electronic device 300 send audio data corresponding to the received audio output to a server system (e.g., the server system 206) and the server system generates the transfer functions 1212, e.g., using the transfer function sub-module 4243.

In some implementations, an aggregation 1204 (e.g., a concatenation) is applied to the transfer functions 1212 to obtain a room transfer function 1214. In some implementations, the aggregation 1204 includes assigning a respective weight to the transfer functions 1212. In some implementations, the room transfer function 1214 is input into the neural network 1206, which outputs a corresponding room frequency correction 1216. In some implementations, the neural network 1206 includes the neural network data 3541 of machine learning database 354. In some implementations, the neural network 1206 includes the neural network data 4401 of machine learning database 218.

In some implementations, the neural network is updated with position information (e.g., feature vectors) and transfer functions corresponding to the locations and/or orientations of the electronic devices 300 (e.g., positioning information 4402 in FIG. 4B). In some implementations, the room frequency correction 1216 is associated with the corresponding positioning information (e.g., as correction data 4403).

In accordance with some implementation, a method for equalizing audio output is performed at a computing system (e.g., the electronic device 300) having one or more speakers (e.g., speaker(s) 324), a plurality of microphones (e.g., microphones 314), one or more processors, and memory. The method includes: (1) outputting audio user content from the one or more speakers (e.g., via audio output module 338) located in a room; and (2) automatically and without user input, equalizing (e.g., via equalization module 346) an audio output of the computing system, the equalizing including: (a) receiving the outputted audio content at each microphone of the plurality of microphones; (b) based on the received audio content, determining an acoustic transfer function (e.g., an impedance) for the room (e.g., via audio analysis sub-module 3461); (c) based on the determined acoustic transfer function, obtaining a frequency response (e.g., decibel gain) for the room (e.g., via audio analysis sub-module 3461); and (d) adjusting one or more properties of the speakers based on the determined frequency response (e.g., via correction sub-module 3462). In some implementations, the equalization is performed independent of any specific user request. In some implementations, the equalization is performed without requiring any action from the user. In some implementations, the computing system determines its location (and the location of its microphones) within the room based on sonar, radar, or via a high-frequency mapping. For example, FIG. 7B shows the electronic device 100 providing audio 712 and FIG. 7C shows the electronic device receiving reflected audio 724. In some implementations, the device 100 generates a transfer function based on the received audio. In these implementations, the device 100 then inputs the transfer function to a neural network and obtains a frequency correction based on the transfer function. In some implementations, the device 100 then applies to the frequency correct to subsequent audio output, thereby equalizing the subsequent audio output as illustrated in FIGS. 5A and 5B.

In some implementations, the acoustic transfer function is determined by utilizing one or more machine learning techniques. In some implementations, the machine learning techniques include utilizing a deep neural network. In some implementations, the machine learning includes supervised training and/or reinforcement training. In some implementations, the machine learning is performed at the computing system (e.g., utilizing the correction sub-module 3462 in conjunction with the machine learning database 354). In some implementations, the machine learning is performed at a remote server system (e.g., server system 206).

In some implementations, the method further includes sending the determined acoustic transfer function to a remote server system (e.g., server system 206); and receives the frequency response from the remote server system in response to sending the determined acoustic transfer function.

In some implementations, the one or more adjusted properties include a frequency property and/or a phase property. In some implementations, adjusting the one or more properties includes adjusting a gain for particular frequencies.

In some implementations, the method further includes, prior to determining the acoustic transfer function, determining that the user content includes audio having a frequency below a transition frequency for the room (e.g., via the audio analysis sub-module 3461). In some implementations, in accordance with a determination that the user content does not include an audio component below the transition frequency, the computing system forgoes determining the acoustic transfer function. In some implementations, the method further includes determining that the user content includes audio having a frequency below a threshold frequency (e.g., below 250 Hz, 300 Hz, or 350 Hz).

In some implementations: (1) the one or more speakers include a plurality of speakers; (2) the method further includes determining relative positioning of the plurality of speakers; and (3) adjusting the one or more properties of the speakers is further based on the relative positioning of the plurality of speakers.

In some implementations, the method further includes determining whether the computing system is operating in a monophonic mode. In some implementations, determining whether the computing system is operating in a stereophonic mode, surround sound mode, 5.1 mode, etc. In some implementations, adjusting the one or more properties of the speakers is further based on an operating mode of the computing system.

In some implementations, the plurality of microphones includes microphones on a plurality of distinct devices. In some implementations, the plurality of microphones and the one or more speakers are positioned within a same device.

In some implementations, determining the acoustic transfer function includes determining whether the one or more speakers are in proximity to one or more boundaries of the room. In some implementations and instances, each proximate boundary results in approximately 3 dB increase at low frequencies. In some implementations, the low frequencies include frequencies in the range of 50 Hz-500 Hz. In some implementations, the low frequencies are frequencies below a transition frequency of the room. In some implementations, the low frequencies correspond to bass frequencies.

In some implementations, the equalizing is continuously performed while the audio user content is outputted. In some implementations, the equalizing is periodically performed while the audio user content is outputted. In some implementations, the equalizing is intermittently performed while the audio user content is outputted.

In some implementations: (1) the method further includes determining relative positioning the plurality of microphones; and (2) the acoustic transfer function is determined based on the relative positioning of the plurality of microphones (e.g., in conjunction with phase differences in the received audio between microphones).

In some implementations, the method further includes determining, via one or more cameras, a respective location of each microphone of the plurality of microphones in the room; and the acoustic transfer function for the room is based on the respective locations.

In accordance with some implementations, a method includes: (1) generating an audio equalization neural network by, for each position of a plurality of positions within a plurality of rooms: (a) positioning an audio system at the position, the audio system having a plurality of microphones and one or more speakers; (b) outputting one or more audio signals via the one or more speakers; (c) obtaining a collection of audio signals by receiving the outputted one or more audio signals at each of the plurality of microphones; (d) obtaining a feature vector for the position based on the collection of audio signals; and (e) adding one or more nodes corresponding to the feature vector to a neural network; and (2) training the equalization neural network.

In some implementations, training the equalization neural network includes supervised training and/or reinforcement training. In some implementations, training the equalization neural network includes training the equalization neural network to generate a compensation function for one or more boundaries in proximity to the one or more speakers. In some implementations, the one or more boundaries include one or more surfaces on which the system is located.

In accordance with some implementations, a computing system (e.g., the electronic device 300) includes: (1) one or more processors (e.g., the processor(s) 302); and (2) memory (e.g., the memory 306) coupled to the one or more processors, the memory storing one or more programs configured to be executed by the one or more processors, the one or more programs including instructions for performing any of the operations or methods described above.

In accordance with some implementations, a non-transitory computer-readable storage medium (e.g., a storage medium within the memory 306) stores one or more programs, the one or more programs comprising instructions, which when executed by a computing system, cause the system to perform any of the operations or methods described above.

Correction Database

In some instances, a local correction database is employed to automatically equalize audio output of an audio device (e.g., audio output of the electronic device 300). Utilizing a local database enables the device to perform equalizations without needing to be communicatively coupled to any other devices. Thus, a user may enjoy equalized audio content even when not in range of any communication networks. For example, as discussed previously with respect to FIG. 10, the device outputs user audio content and the audio content is then received by microphones of the device. In this example, a feature vector is generated based on the received audio content and a corrections database (e.g., a corrections database stored at the device) is queried to obtain a frequency correction. In some instances, the use of a local database in this example enables the device to obtain a frequency correction more quickly than can be obtained from other implementations (e.g., from a remote neural network).

Figure 13:
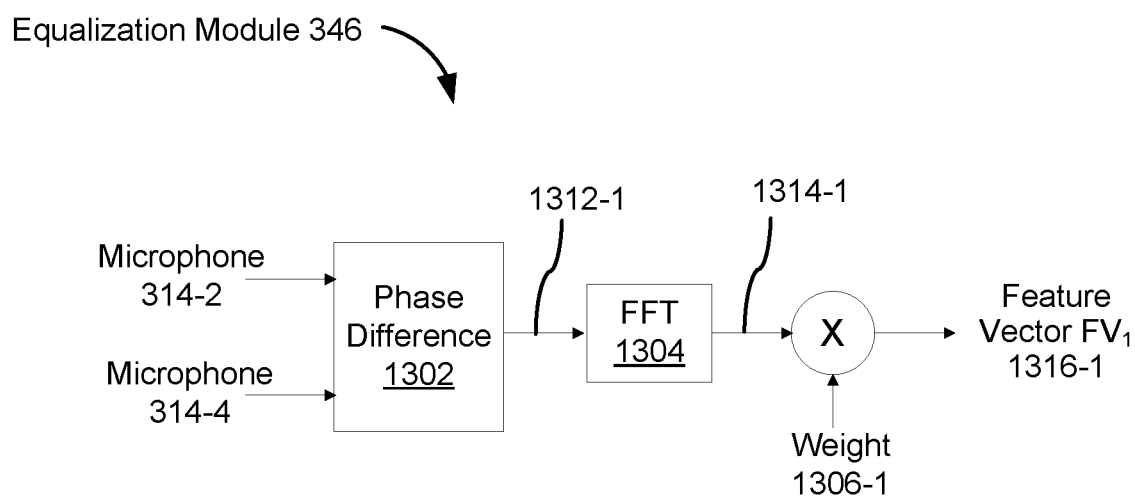
FIG. 13 is a block diagram illustrating audio signal processing carried out at an equalization module of an electronic device, in accordance with some implementations.

FIG. 13 is a block diagram illustrating audio signal processing carried out at the equalization module 346 of the electronic device 300, in accordance with some implementations. In some implementations, the electronic device 300 includes a microphones 314 (e.g., 314-1 through 314-4) and speakers 324. The speakers 324 produce audio and the microphones 314 receive the outputted audio.

In some implementations, based on audio received by the microphone 314-2 and the microphone 314-4, the electronic device 300 applies a phase difference operation 1302 to determine a phase difference 1312-1 between the audio received at the microphone 314-2 and the microphone 314-4

(e.g., using the audio analysis sub-module 3461). In some implementations, the phase difference 1312-1 is used in a fast Fourier transform (FFT) operation 1304 to generate an FFT output 1314-1 (e.g., using the audio analysis sub-module 3461).

In some implementations, the FFT output 1314-1 is assigned a weight 1306-1. In some implementations, the weight 1306-1 is assigned by the weighting sub-module 3464, based on factors including, e.g., relative microphone positions, phase differences, and/or signal-to-noise ratios. In some implementations, the weight 1306-1 is a value (e.g., an integer), and the FFT output 1314-1 is multiplied by the value to obtain a feature vector $FV_1$ 1316-1 corresponding to pair of microphones 314-2, 314-4. In some implementations, the weight 1306-1 is assigned to the phase difference 1312-1 before the FFT operation 1304.

In some implementations, the electronic device 300 includes more than two microphones and accordingly, the audio signaling process illustrated in FIG. 13 is performed for multiple pairs of the microphones to obtain a plurality of corresponding feature vectors 1316. For example, the electronic device 300 is the electronic device 100 in FIG. 1A which includes the microphones 106-1 through 106-6. In this example, a respective feature vector 1316 is obtained for multiple microphone pairs, e.g., for the microphone pairs 106-1 and 106-2, 106-1 and 106-3, 106-4 and 106-5, 106-4 and 106-6. In some implementations, a feature vector of the audio output is obtained by aggregating (e.g., concatenating) the feature vectors 1316 (e.g., by concatenating 1316-1 through 1316-N). Although FIG. 13 shows the equalization module 346, in some implementations, the feature vectors 1316-1 is obtained at the equalization module 214.

FIG. 14A illustrates an example correction database 352 at the electronic device 300, in accordance with some implementations. In some implementations, the correction database 352 comprises a table with columns for feature vectors 1404 and corrections 1406. For example, as shown in FIG. 14A, a feature vector 1404-1 has a corresponding correction 1406-1.

In some implementations, each feature vector 1404 is a weighted concatenation of feature vectors corresponding to individual pairs of microphones. In some implementations, (as shown) the feature vector 1404-1 is represented by $\alpha_{11}FV_{11} + \alpha_{12}FV_{12} + \ldots + \alpha_{1N}FV_{1N}$, where $\alpha_{ij}$ is a weight assigned to the corresponding feature vector $FV_{ij}$. In some implementations, the feature vector $FV_{ij}$ is a feature vector corresponding to a pair j of microphones (e.g., 314-2 and 314-4). In some implementations, a different weight $\alpha_{ij}$ is assigned to different pairs of microphones (e.g., a higher weight is assigned to a front-to-back microphone pair than to a side-to-side microphone pair) and/or different frequency range(s) (e.g., a higher weight is assigned to the frequency range 100-200 Hz than the frequency range 3100-3200 Hz). In some implementations, a different weight $\alpha_{ij}$ is assigned to different pairs of microphones based on the audio received by the pair of microphones (e.g., the signal-to-noise ratio). In some implementations, the feature vector $FV_{11}$ is the feature vector $FV_1$ 1316-1 in FIG. 13. In some implementations, each of the feature vectors $FV_{11}$ through $FV_{1N}$ in 1404-1 is obtained using the audio signal processing carried out at the equalization module 346 as described in FIG. 13.

FIG. 14B shows a structure of a representative feature vector $FV_{11}$ 1414-1 in accordance with some implementations. As shown in FIG. 14B, the feature vector $FV_{11}$ includes a function of phase differences (e.g. denoted by $\Delta\varphi$) at different frequencies (e.g. denoted by the subscripts f1, f2, and fn etc.) in accordance with some implementations.

In some implementations, as shown in FIG. 14A, the correction 1406-1 includes a correction coefficient for each of a plurality of bands of audio frequencies. In some implementations, (as shown) the correction 1406-1 is represented as $[C_{11}(f_{0-10}), C_{12}(f_{11-30}), \ldots, C_{1X}(f_{M-N})]$, where $C_{11}$, $C_{12}$, and $C_{1X}$ are correction coefficients corresponding to the bands of frequencies $(f_{0-10})$, $(f_{11-30})$, and $(f_{M-N})$ respectively, and where $(f_{0-10})$ denotes the frequency band of 0-10 Hz, $(f_{11-30})$ denotes the frequency band of 11-30 Hz, and $(f_{M-N})$ denotes the frequency band of M-N Hz. In some implementations, the correction 1406-1 contains only frequencies below a transition frequency (e.g., the transition frequency $F_T$ 506 in FIG. 5A) and thus no correction is applied to frequencies above the transition frequency $F_T$ 506.

In some implementations, to equalize audio output of a device, a feature vector is generated and then compared to the feature vectors 1404 in the correction database 352 (e.g., to determine which feature vector 1404 is most similar to the generated feature vector) to obtain the corresponding correction 1406. In some implementations, the comparison includes applying a k-nearest neighbors algorithm. In some implementations, the comparison includes determining a Euclidean distance between the generated feature vector and each of the feature vectors 1404. In some implementations, the comparison includes performing a least mean square (LMS) operation. Although FIG. 14A shows the correction database 352, in some implementations, the feature vectors 1404 and the corrections 1406 are stored in the correction database 216.

In accordance with some implementations, a method for equalizing audio output is performed at an electronic device (e.g., the electronic device 300) having one or more speakers, a plurality of microphones, one or more processors, and memory. In some implementations, the method includes: (1) outputting audio user content from the one or more speakers (e.g., the speaker(s) 324) located in a room; and (2) automatically and without user input, equalizing subsequent audio output of the electronic device (e.g., via the equalization module 346), the equalizing including: (a) obtaining a collection of audio content signals (e.g., via the microphone module 340), including receiving the outputted audio content at each microphone of the plurality of microphones; (b) determining from the collection of audio content signals a plurality of phase differences (e.g., transfer functions) between microphones of the plurality microphones (e.g., via the audio analysis sub-module 3461); (c) obtaining a feature vector based on the plurality of phase differences (e.g., via the audio analysis sub-module 3461); (d) obtaining a frequency correction (e.g., frequency correction curve) from a correction database (e.g., the correction database 352) based on the obtained feature vector (e.g., via the correction sub-module 3462); and (e) applying the obtained frequency correction to the subsequent audio output (e.g., via audio output module 338). In some implementations, applying the obtained frequency correction includes adjusting (lowering) a gain for a particular range of frequencies.

In some implementations, the electronic device 300 performs operations (1) and (2) without input from external or remote devices. Thus, the electronic device 300 is enabled to perform the audio equalization while not communicatively coupled to any other devices.

In some implementations, the method further includes determining one or more phase differences (e.g., via the audio analysis sub-module 3461) between the outputted audio content and received audio content at one or more of the microphones. In some implementations, the microphones are positioned so as to be near-field with one another.

In some implementations, the correction database is stored at the electronic device (e.g., the correction database 352). In some implementations, the correction database includes a plurality of feature vectors (e.g., the frequency responses 3526), each feature vector having a corresponding frequency correction (e.g., the frequency corrections 3527). In some implementations, each feature vector of the plurality of feature vectors corresponds to a particular positioning of electronic device within a room.

In some implementations, the method further includes: (1) positioning a speaker device (e.g., the electronic device 100) at a particular position within a structure; (2) outputting via the speaker device training audio; (3) receiving the outputted training audio at two or more microphones; (4) generating a reference feature vector and reference frequency correction based on the outputted training audio (e.g., via the audio analysis sub-module 3461); and (5) adding the reference feature vector and reference frequency correction to the correction database (e.g., the correction database 352). In some implementations, the training audio (e.g., the training audio 3524) includes pink noise and/or a combination of music from a plurality of music genres. In some implementations, generating the reference frequency correction includes applying the ABC method to the reference feature vector.

In some implementations, obtaining the frequency correction from the correction database includes: (1) identifying a first feature vector of the plurality of feature vectors based on a comparison with the obtained feature vector; and (2) selecting the frequency correction that corresponds to the first feature vector. In some implementations, the comparison includes performing a least mean square (LMS) operation on the plurality of feature vectors. In some implementations, the comparison includes determining a Euclidean distance between the feature vectors. In some implementations, the comparison includes applying k-nearest neighbors algorithm. In some implementations, the comparison includes identifying a feature vector of the plurality of feature vectors that is most similar to the obtained feature vector.

In some implementations, equalizing subsequent audio output includes equalizing a frequency band of subsequent audio output (e.g., a frequency band of 50 Hz-300 Hz). In some implementations: (1) the frequency band consists of a plurality of sub-bands; and (2) determining the plurality of phase differences includes, for a first and second microphone of the plurality of microphones: for each sub-band of the plurality of sub-bands, determining a corresponding phase difference between the first and second microphones; and (3) the feature vector is composed at least in part by concatenating a predefined function of the plurality of phase differences.

In some implementations, determining the plurality of phase differences includes: (1) designating a plurality of microphone pairs from the plurality of microphones; and (2) for each microphone pair of the plurality of microphone pairs, determining a phase difference (e.g., a transfer function) between the received audio content at each microphone in the microphone pair. In some implementations, obtaining the feature vector includes applying a fast Fourier transform (FFT) to the plurality of phase differences.

In some implementations, receiving the outputted audio content at each microphone includes receiving outputted audio content for a predetermined time period. In some implementations, the predetermined time period is 0.5 seconds, 1 second, 2 seconds, etc.

In some implementations: (1) the method further includes assigning a plurality of weights (e.g., the weights 3523) to the plurality of phase differences such that each phase difference of the plurality of phase differences is assigned a corresponding weight; and (2) the feature vector is based on the weighted plurality of phase differences. In some implementations, the plurality of weights is based on a signal-to-noise ratio for the received audio content at each microphone. In some implementations, the plurality of weights is based on relative positioning of the plurality of microphones. For example, microphones arranged so as to increase a relative phase difference in the outputted audio received at the microphones are weighted more highly than microphones in other arrangements.

In some implementations, the method further includes, prior to obtaining the feature vector, determining that the outputted audio content includes audio having a frequency below a transition frequency for the room. In some implementations, the method further includes, prior to obtaining the feature vector, determining that the outputted audio content includes audio content in the range of 50 Hz-500 Hz. In some implementations, the method further includes, prior to obtaining the feature vector, determining that the outputted audio content includes bass frequencies. In some implementations, the method includes: (1) determining that the outputted audio content does not include audio having a frequency below the transition frequency; and (2) forgoing obtaining the feature vector.

In some implementations, prior to obtaining the feature vector, the method further includes determining (e.g., the audio analysis sub-module 3461) that the outputted audio content has an acoustic energy that meets one or more energy criteria for a particular range of frequencies (e.g., a range from 50 Hz to 500 Hz). In some implementations, in accordance with a determination that the outputted audio content does not have an acoustic energy that meets the one or more energy criteria, the method includes forgoing obtaining the feature vector.

In some implementations, prior to obtaining the feature vector, the method includes determining (e.g., the audio analysis sub-module 3461) that the outputted audio content has an audio coherence that meets one or more signal-to-noise criteria. In some implementations, in accordance with a determination that the outputted audio content does not have a coherence that meets the one or more criteria, the method includes forgoing obtaining the feature vector.

In accordance with some implementations, a method of generating a correction database (e.g., the correction database 352) includes: (1) for each position of a plurality of positions within a plurality of rooms: (a) positioning a speaker device (e.g., an electronic device 100) at the position; (b) outputting via the speaker device training audio (e.g., outputting the training audio via the speakers 102 and/or the speakers 104); (c) receiving the outputted training audio at two or more microphones (e.g., the microphones 106); (d) generating a reference feature vector and reference frequency correction based on the outputted training audio (e.g., utilizing transfer function sub-module 3463 and correction sub-module 3462); and (e) adding the reference feature vector and reference frequency correction to the correction database.

In accordance with some implementations, a computing system (e.g., the electronic device 300) includes: one or more processors; and memory coupled to the one or more processors, the memory storing one or more programs configured to be executed by the one or more processors, the one or more programs including instructions for performing any of the above methods and/or operations.

In accordance with some implementations, a non-transitory computer-readable storage medium (e.g., within the memory 306) stores one or more programs, the one or more programs comprising instructions, which when executed by a computing system, cause the system to perform any of the above methods and/or operations.

For situations in which the systems discussed above collect information about users, the users may be provided with an opportunity to opt in/out of programs or features that may collect personal information (e.g., information about a user's preferences or usage of a smart device). In addition, in some implementations, certain data may be anonymized in one or more ways before it is stored or used, so that personally identifiable information is removed. For example, a user's identity may be anonymized so that the personally identifiable information cannot be determined for or associated with the user, and so that user preferences or user interactions are generalized (for example, generalized based on user demographics) rather than associated with a particular user.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first electronic device could be termed a second electronic device, and, similarly, a second electronic device could be termed a first electronic device, without departing from the scope of the various described implementations. The first electronic device and the second electronic device are both electronic devices, but they are not the same type of electronic device.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A method for equalizing audio at an electronic device located in a defined space, comprising:
    outputting first audio content from at least one speaker of the electronic device;
    capturing, via a plurality of microphones, audio data representing a set of reflections of the first audio content within the defined space;
    obtaining, by a processor of the electronic device, a feature vector indicating a set of characteristics of the audio data that was captured via the plurality of microphones;
    obtaining, by the processor, a frequency correction based on the feature vector; and
    applying, by the processor, the frequency correction to subsequent audio content.

2. The method of claim 1, further comprising:
    prior to the outputting:
        outputting, via a speaker device positioned at a particular position, training audio,
        receiving the outputted training audio,
        generating a reference frequency correction based on the outputted training audio, and
        storing the reference frequency correction.

3. The method of claim 1, further comprising:
    determining a plurality of phase differences of the audio data that was captured between different microphones of the plurality of microphones.

4. The method of claim 3, wherein obtaining the feature vector comprises:
    obtaining, by the processor, the feature vector based on the plurality of phase differences.

5. The method of claim 4, further comprising:
    assigning a plurality of weights to the plurality of phase differences such that each phase difference of the plurality of phase differences is assigned a corresponding weight;
    and wherein the feature vector is based on the plurality of phase differences with the plurality of weights assigned thereto.

6. The method of claim 5, wherein the plurality of weights is based on a signal-to-noise ratio for the audio data that was captured at each microphone of the different microphones of the plurality of microphones.

7. The method of claim 3, wherein the plurality of weights is based on relative positioning of the plurality of microphones.

8. The method of claim 4, wherein obtaining the feature vector based on the plurality of phase differences comprises:
    applying a fast Fourier transform (FFT) to the plurality of phase differences.

9. The method of claim 1, wherein the first audio content comprises at least one of: audio content that is selected by a user of the electronic device, a test signal, or training audio.

10. The method of claim 1, wherein applying the frequency correction to the subsequent audio content comprises:
adjusting a gain for a particular range of frequencies.

11. An electronic device located in a defined space, comprising:
at least one speaker;
a plurality of microphones;
a memory storing at least one computer program; and
a processor interfaced with the at least one speaker, the plurality of microphones, and the memory, and configured to execute the at least one computer program to cause the processor to:
cause the at least one speaker to output first audio content,
capture, via the plurality of microphones, audio data representing a set of reflections of the first audio content within the defined space,
obtain a feature vector indicating a set of characteristics of the the audio data that was captured via the plurality of microphones,
obtain a frequency correction based on the feature vector, and
apply the frequency correction to subsequent audio content.

12. The electronic device of claim 11, wherein the processor is further configured to:
determine a plurality of phase differences of the audio data that was captured between different microphones of the plurality of microphones.

13. The electronic device of claim 11, wherein the processor is further configured to:
prior to obtaining the feature vector, determine that the first audio content comprises audio having a frequency below a transition frequency for the defined space.

14. The electronic device of claim 11, wherein the processor is further configured to:
prior to obtaining the feature vector, determine that the first audio content comprises an acoustic energy that meets at least one energy criteria for a particular range of frequencies.

15. The electronic device of claim 11, wherein the processor is further configured to:
prior to obtaining the feature vector, determine that the first audio content comprises an audio coherence that meets at least one signal-to-noise criteria.

16. A non-transitory computer-readable storage medium storing one or more programs, the one or more programs comprising instructions, which when executed by an electronic device located in a defined space and comprising at least one speaker, a plurality of microphones, a processor, and memory, cause the electronic device to perform operations comprising:
outputting first audio content from the at least one speaker;
capturing, via the plurality of microphones, audio data representing a set of reflections of the first audio content within the defined space;
obtaining a feature vector indicating a set of characteristics of the audio data that was captured via the plurality of microphones;
obtaining a frequency correction based on the feature vector; and
applying the frequency correction to subsequent audio content.

17. The non-transitory computer-readable storage medium of claim 16, wherein the operations further comprise:
determining a plurality of phase differences of the audio data that was captured between different microphones of the plurality of microphones.

18. The non-transitory computer-readable storage medium of claim 16, wherein the first audio content comprises at least one of: audio content that is selected by a user of the electronic device, a test signal, or training audio.

19. The non-transitory computer-readable storage medium of claim 16, wherein applying the frequency correction to the subsequent audio content comprises:
adjusting a gain for a particular range of frequencies.

20. The non-transitory computer-readable storage medium of claim 16, wherein the operations further comprise:
prior to obtaining the feature vector, determining that the first audio content comprises audio having a frequency below a transition frequency for the defined space.

* * * * *